United States Patent
Namekawa et al.

(10) Patent No.: US 8,716,998 B2
(45) Date of Patent: May 6, 2014

(54) DC-DC CONVERTER AND DIGITAL PULSE WIDTH MODULATOR

(75) Inventors: Toshimasa Namekawa, Tokyo (JP); Daisuke Miyashita, Kawasaki (JP); Jun Deguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 13/251,343

(22) Filed: Oct. 3, 2011

(65) Prior Publication Data
US 2012/0242314 A1    Sep. 27, 2012

(30) Foreign Application Priority Data
Mar. 24, 2011  (JP) .................................. 2011-065659

(51) Int. Cl.
*H02M 3/157* (2006.01)

(52) U.S. Cl.
USPC ....................................................... 323/283

(58) Field of Classification Search
USPC ................. 323/283, 222, 225, 268, 271, 282; 327/172–176
See application file for complete search history.

(56) References Cited

U.S. PATENT DOCUMENTS

| | | | |
|---|---|---|---|
| 6,535,043 B2 * | 3/2003 | Chen ............................. | 327/175 |
| 7,019,505 B2 * | 3/2006 | Dwarakanath et al. ....... | 323/283 |
| 8,120,401 B2 * | 2/2012 | Kenly et al. ................... | 327/172 |
| 2009/0315598 A1 | 12/2009 | Namekawa | |

* cited by examiner

*Primary Examiner* — Matthew Nguyen
*Assistant Examiner* — Jye-June Lee
(74) *Attorney, Agent, or Firm* — White & Case LLP

(57) ABSTRACT

A DC-DC converter has a switching element, a lowpass filter, an oscillator, an AD converter, an error signal generator, a counter, a comparator, a selector configured to select one of the plurality of clock signals in accordance with a value of a lower side bit of the error signal in sync with a timing when the comparator detects coincidence, and a switching controller configured to control ON/OFF of the switching element in accordance with the clock signal selected by the selector. The selector selects one among the plurality of clock signals and a new clock signal generated by combining two or more clock signals comprising neighboring phases among the plurality of clock signals.

11 Claims, 17 Drawing Sheets

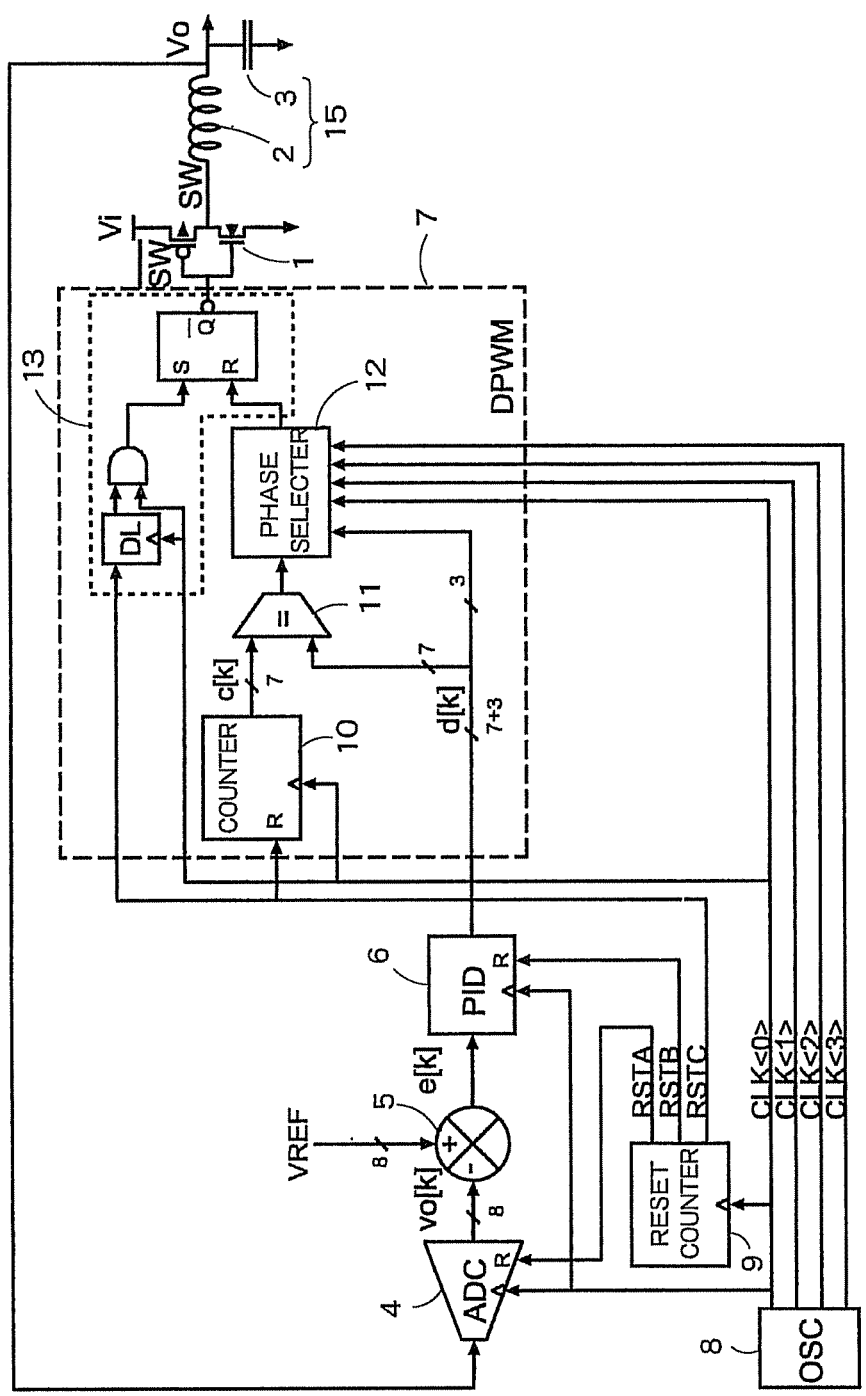
F I G. 1

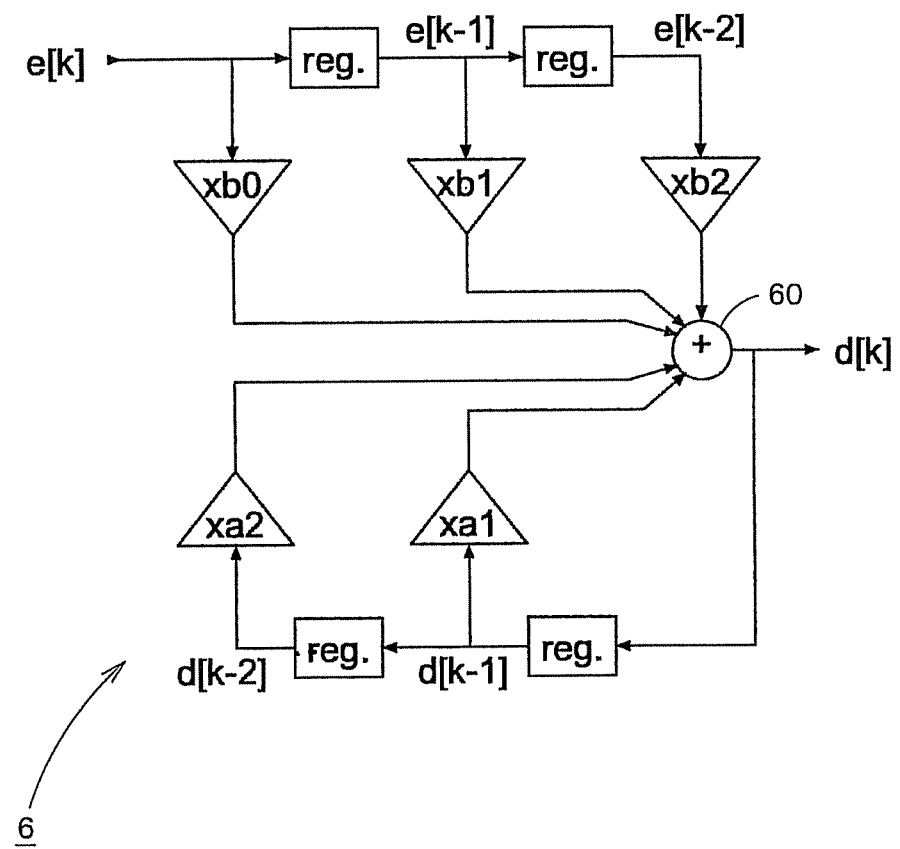
F I G. 3

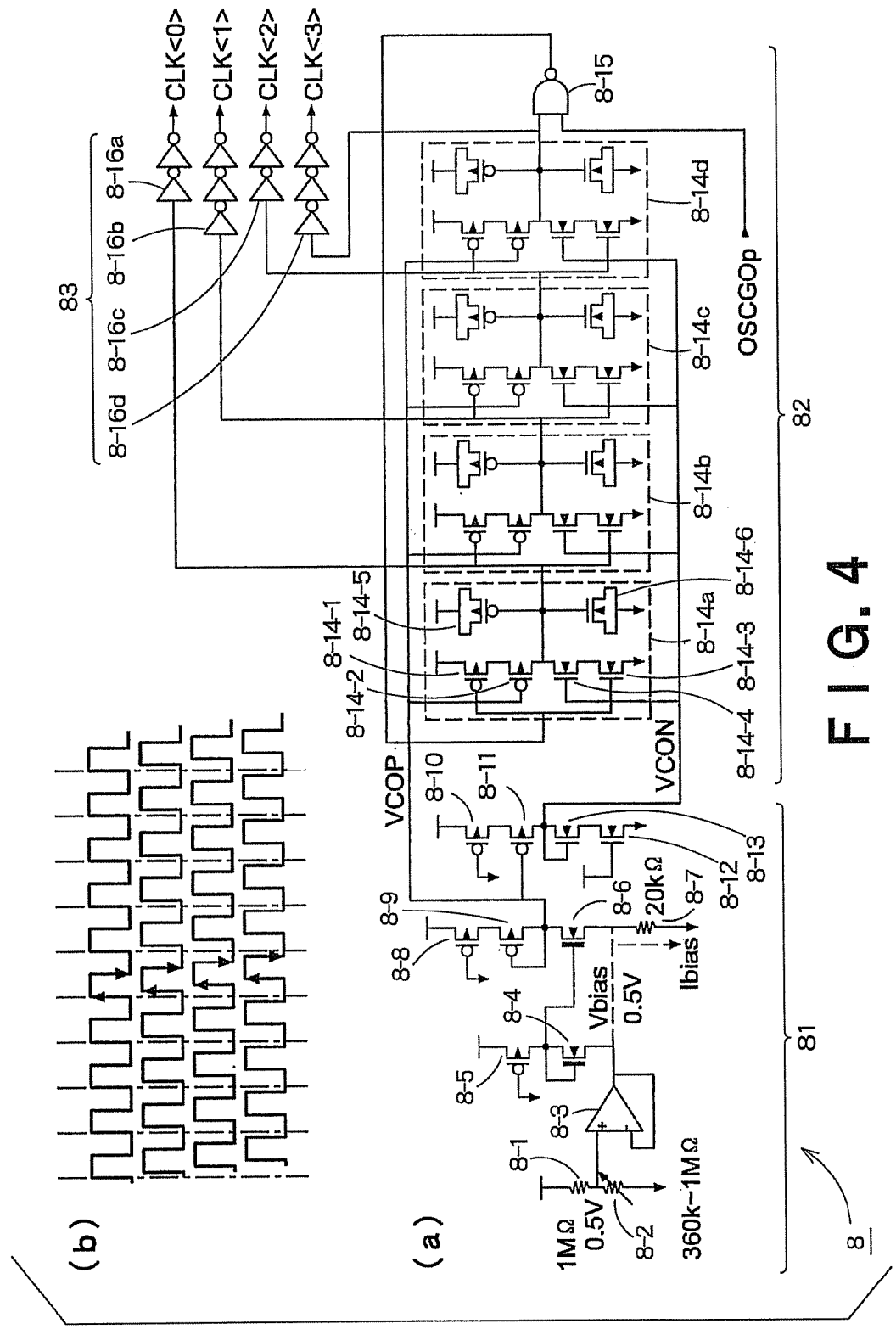
F I G. 4

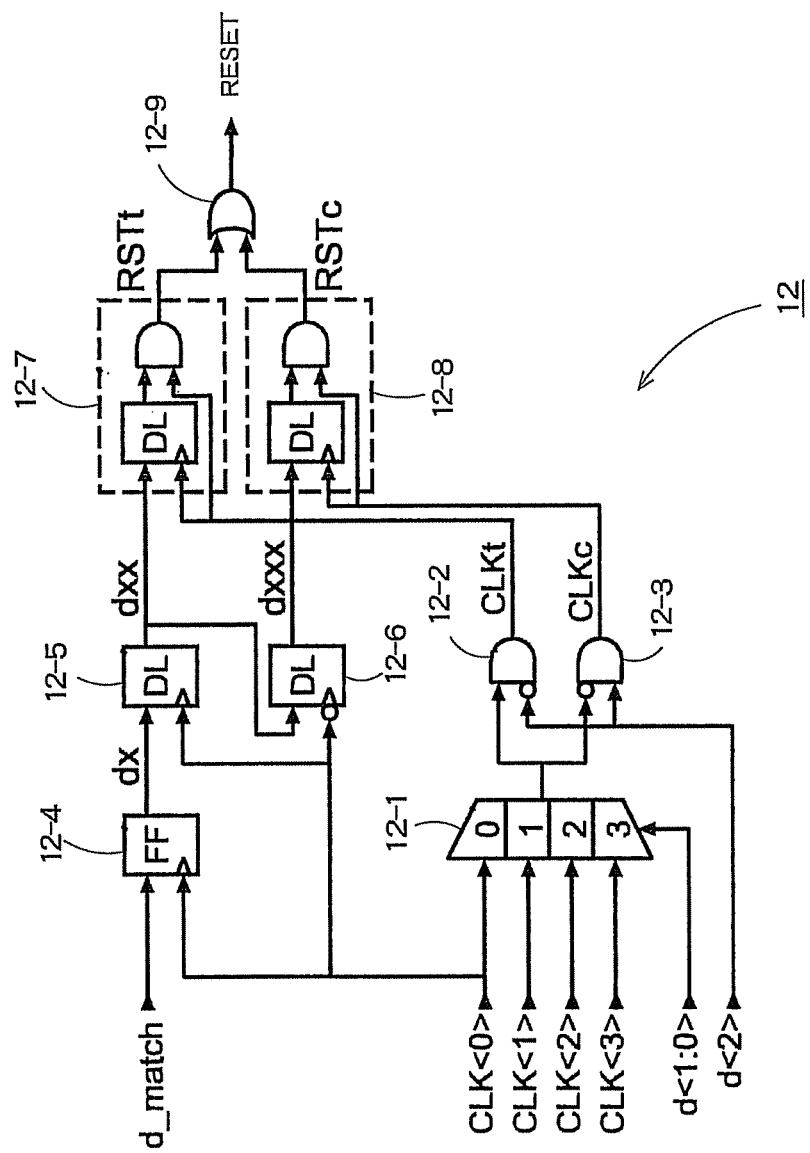
F I G. 5

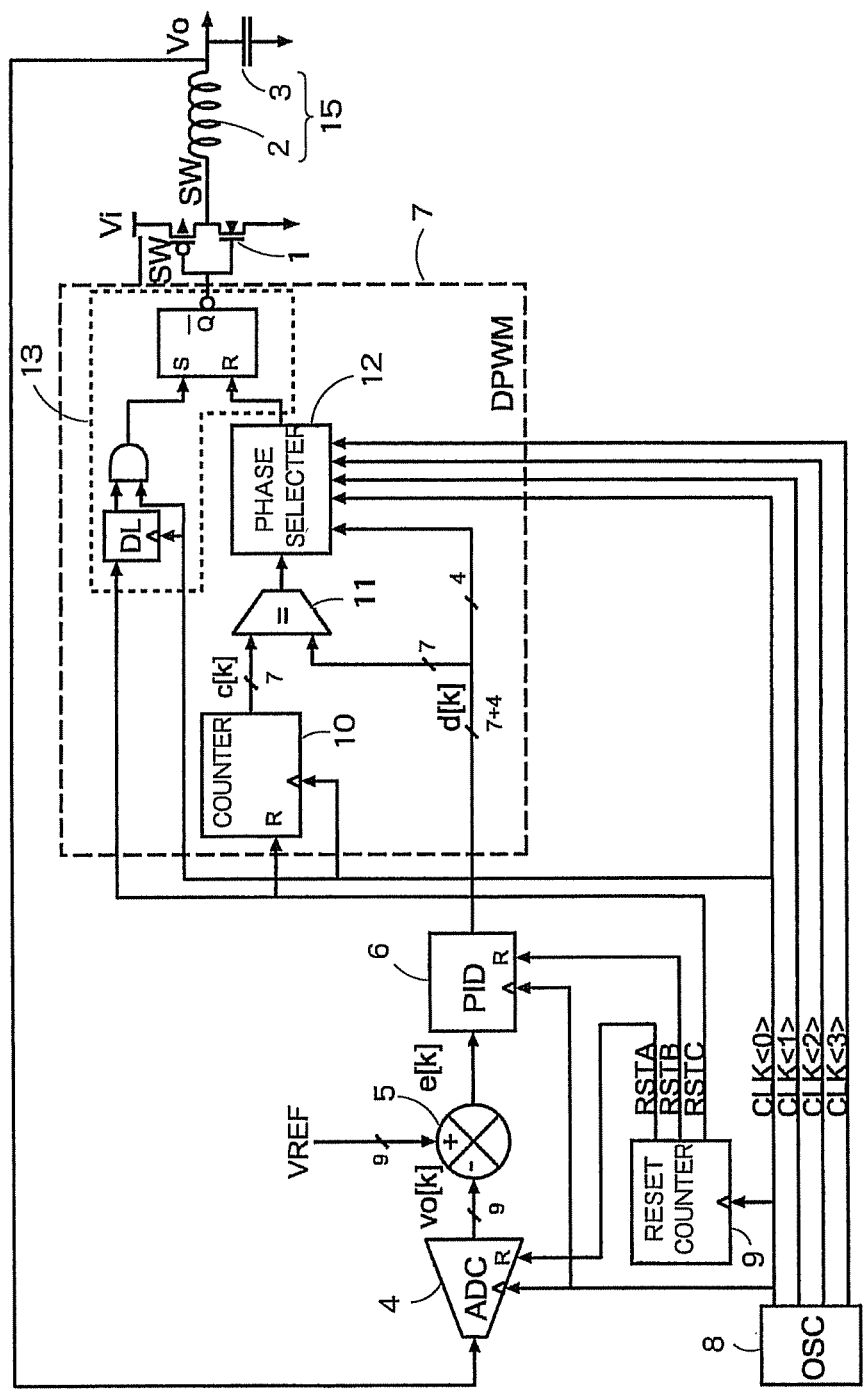
F I G. 8

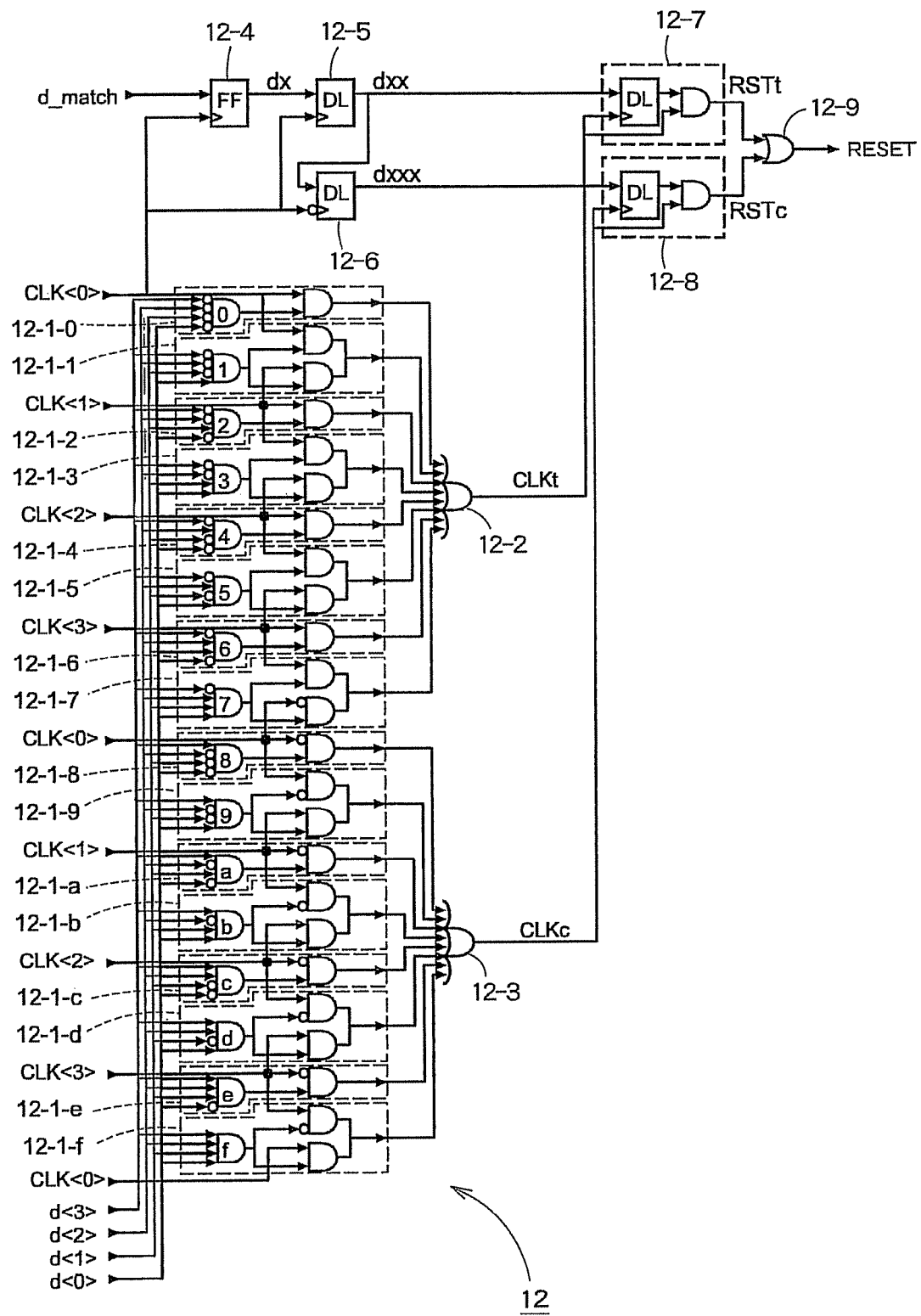
F I G. 9

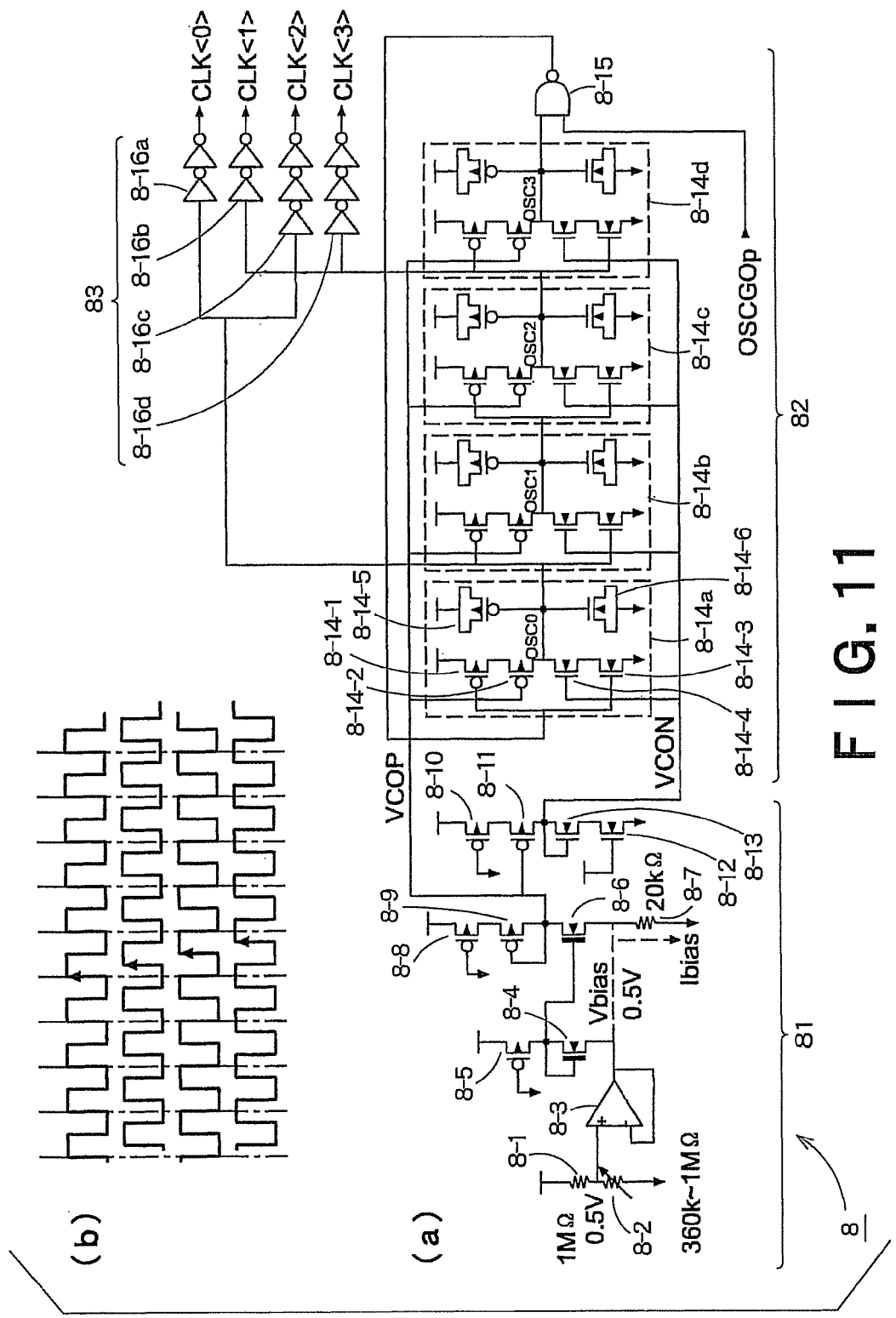
F I G. 11

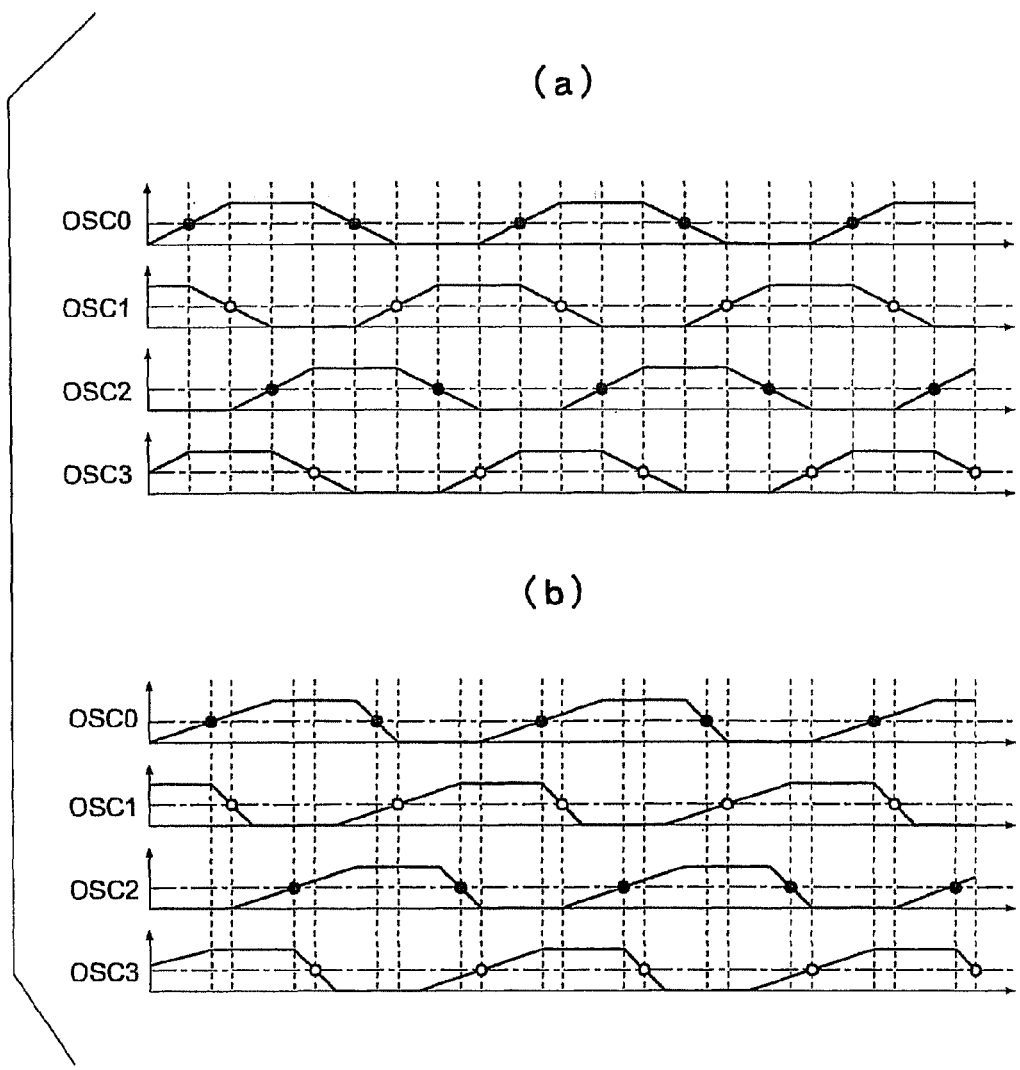
F I G. 12

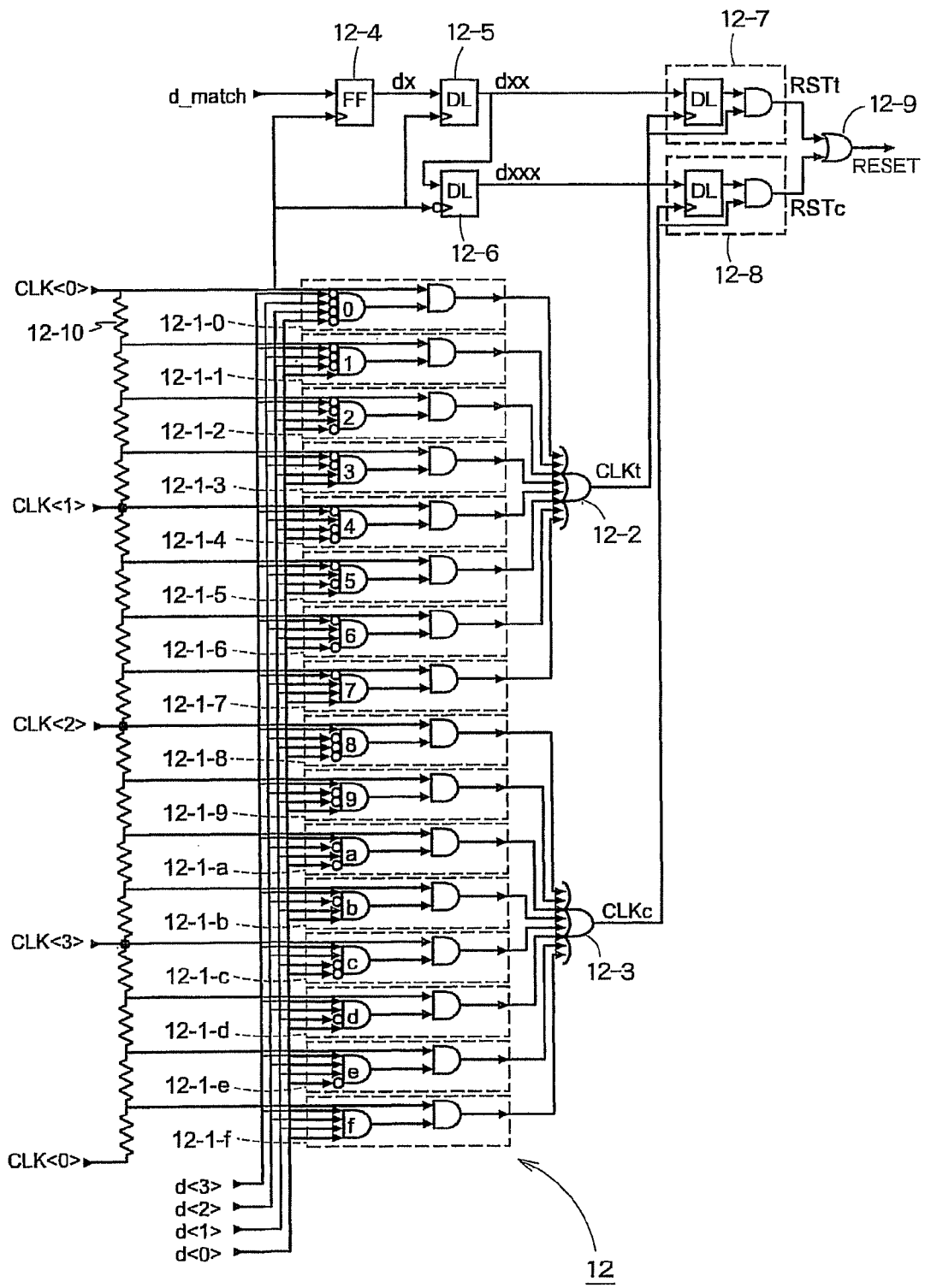
F I G. 13

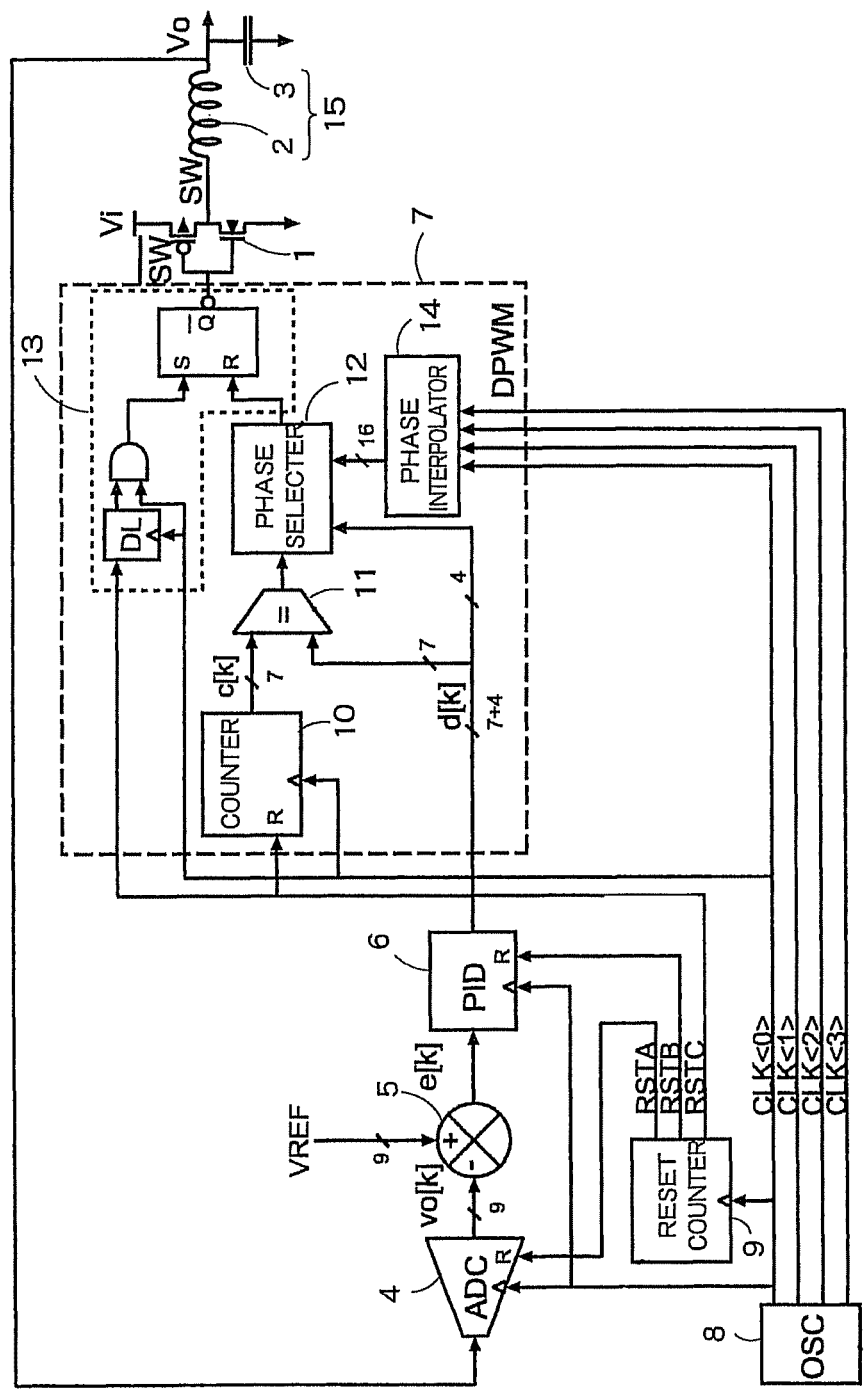
F I G. 14

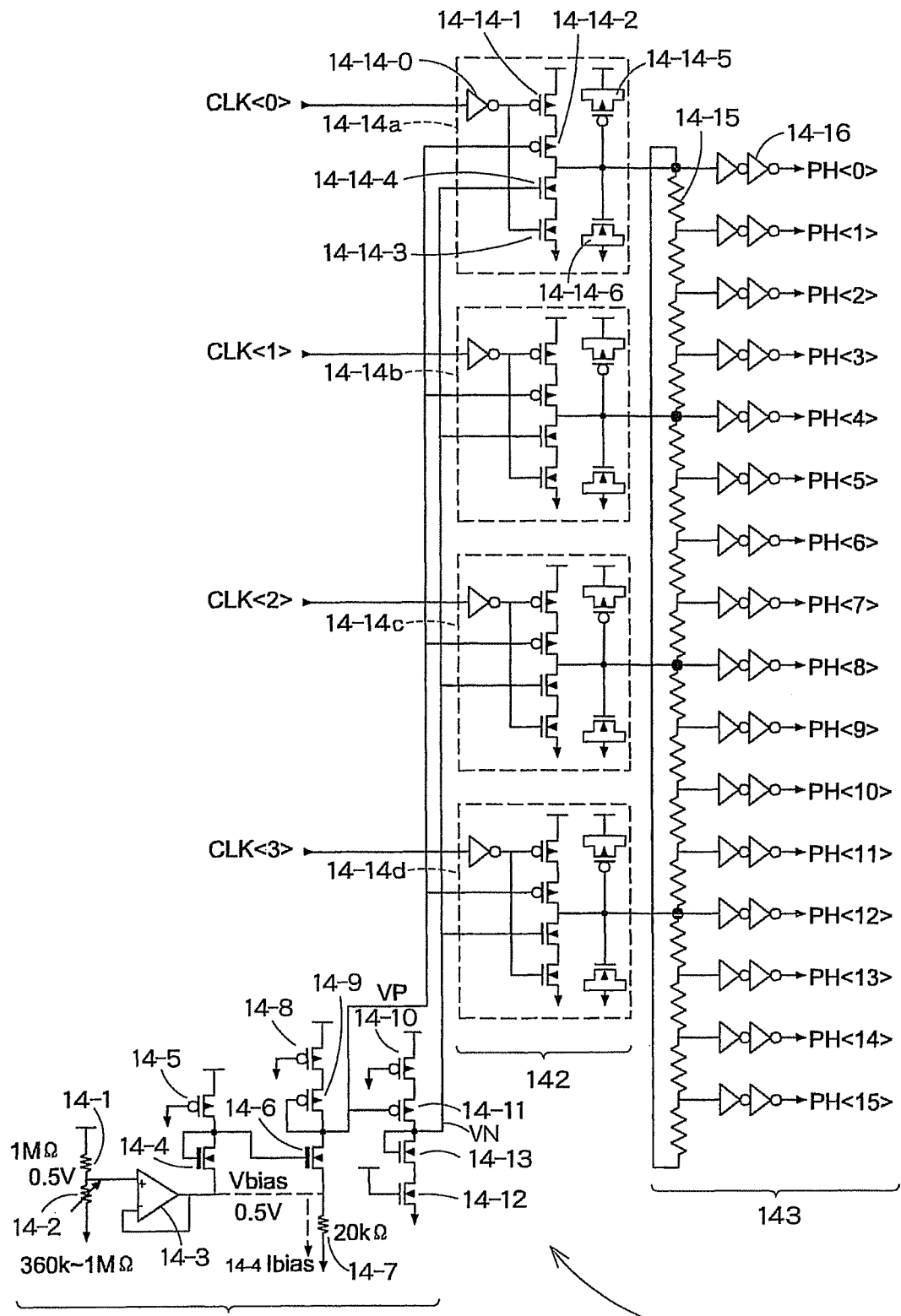
F I G. 15

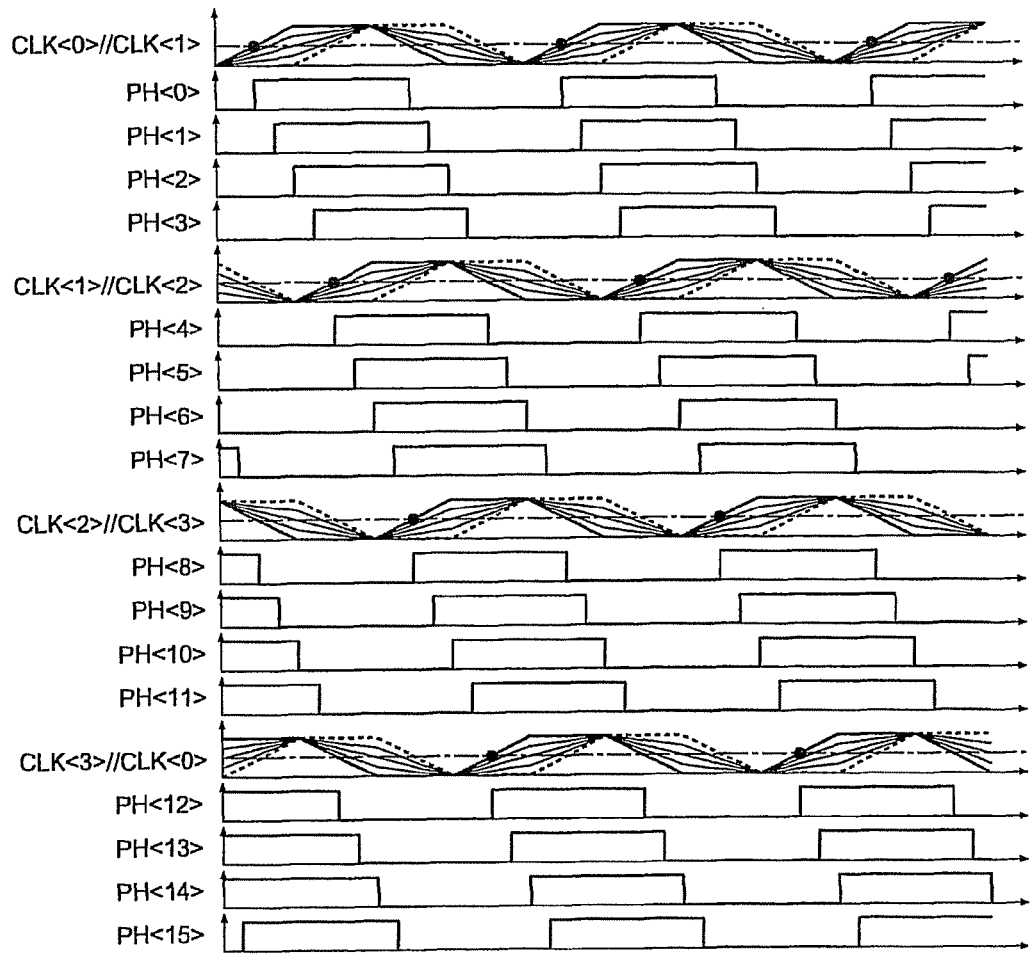
F I G. 16

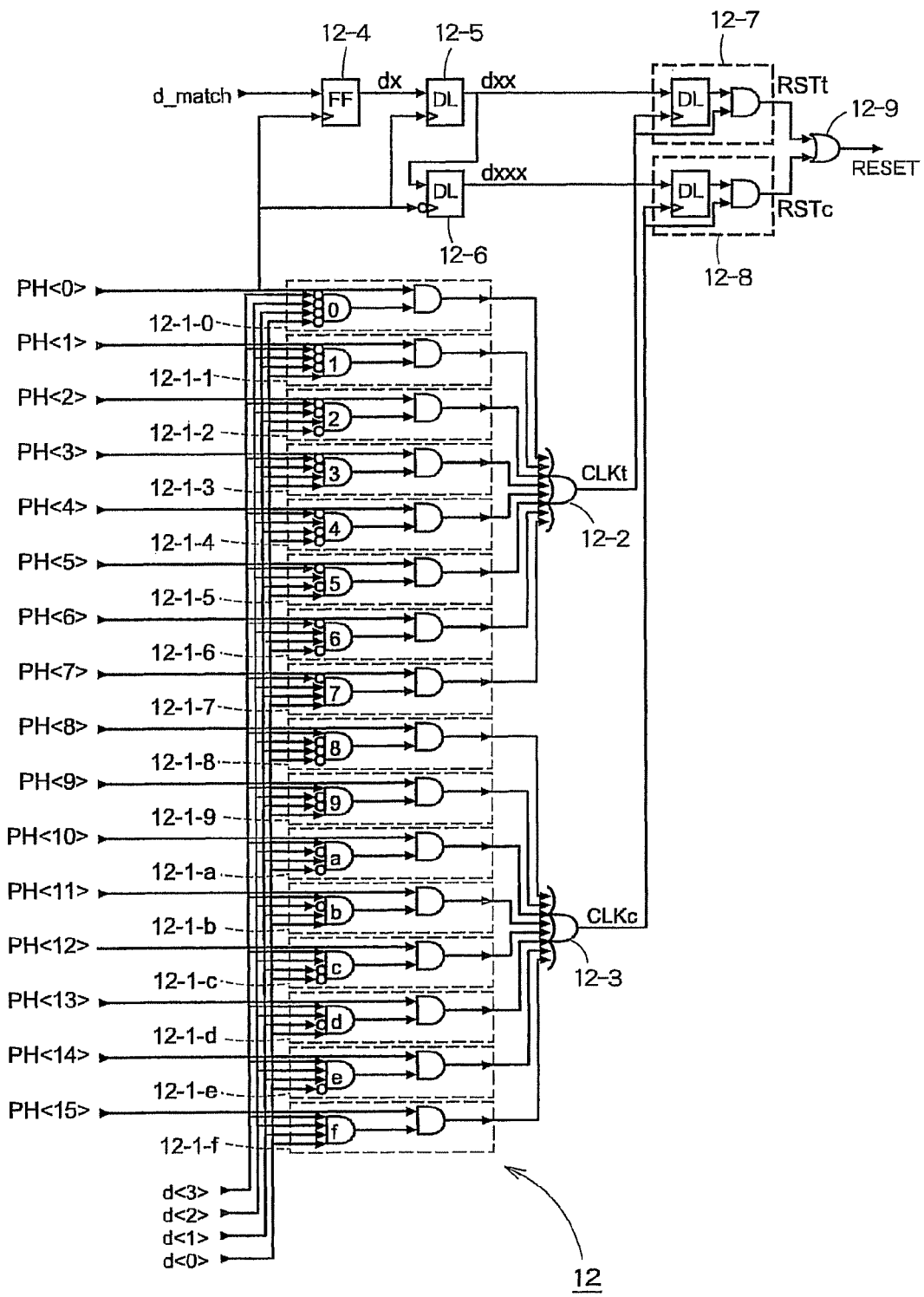
F I G. 17

DC-DC CONVERTER AND DIGITAL PULSE WIDTH MODULATOR

CROSS REFERENCE TO RELATED APPLICATIONS

This application is based upon and claims the benefit of priority from the prior Japanese Patent Application No. 2011-65659, filed on Mar. 24, 2011, the entire contents of which are incorporated herein by reference.

FIELD

Embodiments of the present invention relate to a DC-DC converter and a digital pulse width modulator for converting direct current voltage by digital signal processing.

BACKGROUND

Recently, the integration level and speed of integrated circuits have been more improved, and it is required to produce a direct-current power supply capable of supplying high current exceeding 30 amperes with low voltage about 1 Volt. Generally, a switching power supply is used as a direct-current power supply for generating high current with low voltage.

As an example of the switching power supply, there is a direct current voltage converter (DC-DC converter) which obtains a rectangular wave output by repeating on/off operation by a switch element such as a field effect transistor, and obtains direct-current power supply by smoothing the rectangular wave output by a lowpass filter formed of an inductor and a capacitor.

BRIEF DESCRIPTION OF THE DRAWINGS

FIG. 1 is a block diagram showing a schematic structure of a digitally-controlled switching power supply according to a first embodiment.

FIG. 3 is a detailed block diagram of an output voltage feedback-controlling PID compensator 6.

FIG. 4(a) is a circuit diagram showing a detailed structure of a synchronous clock signal oscillator 8, and FIG. 4(b) is a waveform diagram of the output signals from the synchronous clock signal oscillator 8.

FIG. 5 is a circuit diagram showing a detailed structure of a multi clock signal phase selector 12.

FIG. 8 is a block diagram showing a schematic structure of a digitally-controlled switching power supply according to a second embodiment.

FIG. 9 is a circuit diagram showing a detailed structure of the multiphase clock signal phase selector 12 applied to the present embodiment.

FIG. 11(a) is a circuit diagram showing a detailed structure of the synchronous clock signal oscillator 8 according to a third embodiment, and FIG. 11(b) is a waveform diagram of the circuit.

FIGS. 12(a) and 12(b) are diagrams showing the waveforms of outputs OSC0, OSC1, OSC2, and OSC3 from four delay time adjusting inverters 8-14a, 8-14b, 8-14c, and 8-14d.

FIG. 13 is a circuit diagram showing a detailed structure of the multiphase clock signal phase selector 12 according to the third embodiment.

FIG. 14 is a block diagram showing a schematic structure of a digitally-controlled switching power supply according to a fourth embodiment.

FIG. 15 is a circuit diagram showing a detailed structure of a multiphase clock signal phase interpolator 14.

FIG. 16 is an operation waveform diagram of the multiphase clock signal phase interpolator 14.

FIG. 17 is a circuit diagram showing a detailed structure of the multiphase clock signal phase selector 12 employable in the present embodiment.

DETAILED DESCRIPTION

Figure 2:
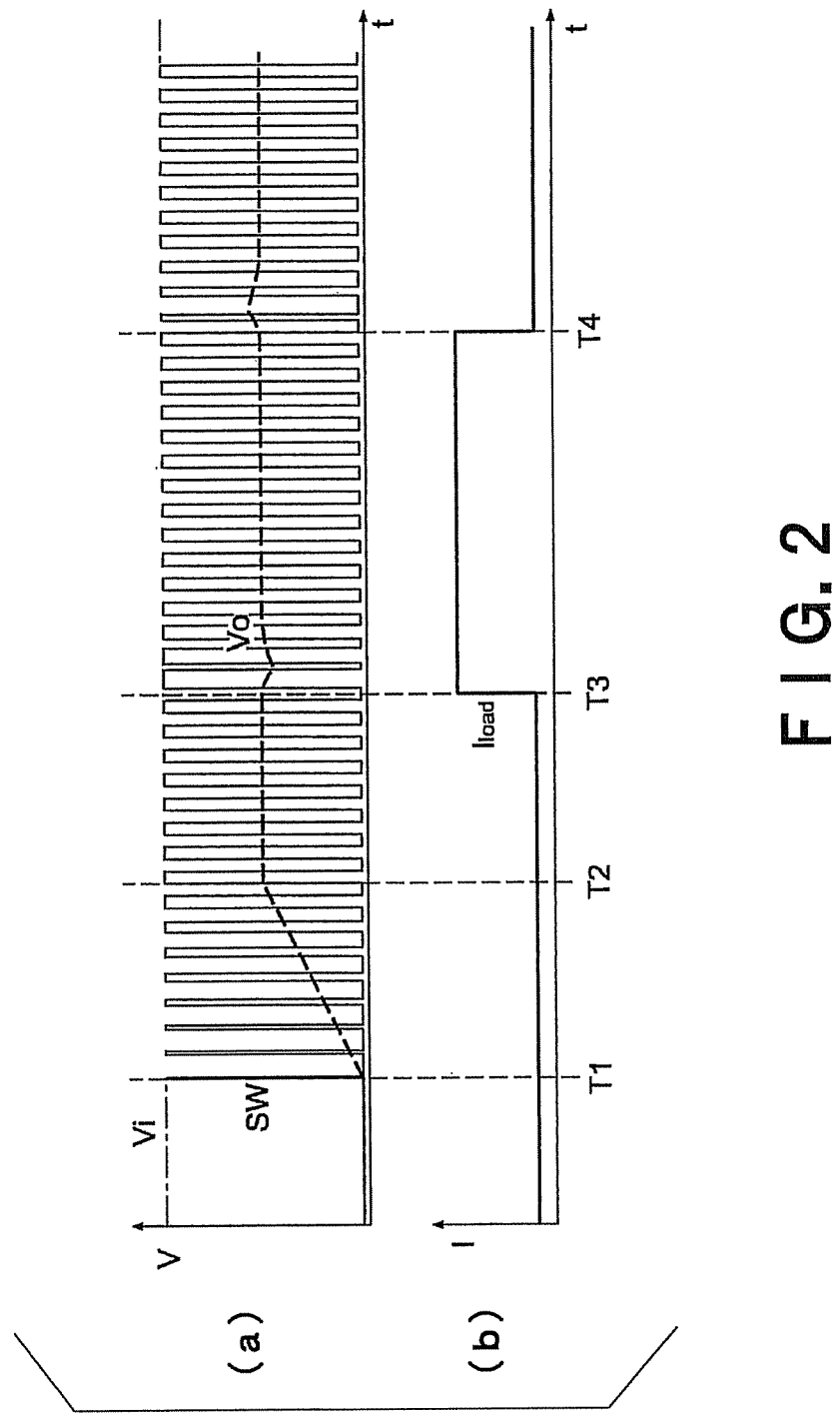
FIGS. 2(a) and 2(b) are operation waveform diagrams of the switching power supply of FIG. 1.

Embodiments will now be explained with reference to the accompanying drawings.

A DC-DC converter configured to convert a first DC voltage into a second DC voltage has:

a switching element configured to switch whether or not the first DC voltage is supplied to an output side;

a lowpass filter configured to rectify an output side signal of the switching element to generate the second DC voltage;

an oscillator configured to generate a plurality of clock signals each comprising a different phase;

an AD converter configured to convert the second DC voltage into a first digital value comprising a plurality of bits;

an error signal generator configured to generate an error signal comprising a plurality of bits, the error signal expressing a difference between the first digital value and a second digital value corresponding to a reference voltage;

a counter configured to perform a counting operation in sync with a predetermined clock signal;

a comparator configured to detect whether or not a value of an upper side bit of the error signal coincides with a count value of the counter;

a selector configured to select one of the plurality of clock signals in accordance with a value of a lower side bit of the error signal in sync with a timing when the comparator detects coincidence; and a switching controller configured to control ON/OFF of the switching element in accordance with the clock signal selected by the selector.

The selector selects one among the plurality of clock signals and a new clock signal generated by combining two or more clock signals comprising neighboring phases among the plurality of clock signals.

The DC-DC converter according the present embodiments has internal elements each having an extremely small resistance value and thus heat generated by the current passing therethrough can be restrained, which leads to the characteristics that power consumed to convert voltage is small and power can be converted with high efficiency.

As voltage becomes lower and current becomes higher, it becomes more difficult to ensure the accuracy and stability of the power supply. The switching power supply controls output voltage by changing the duty ratio of on/off time of rectangular wave. In order to improve the performance of the switching power supply, the output voltage must be controlled with high accuracy and at high speed. In order to control the output voltage with high accuracy, it is required to keep the oscillation frequency of the rectangular wave constant as much as possible and to control the pulse width with fine granularity. Further, the amount of change increases as the current value becomes larger, and thus the speed for controlling the pulse width of the rectangular wave must be correspondingly increased to control the output voltage at high speed.

In a conventional switching power supply, a differential amplifier detects the difference between output power voltage and reference voltage and amplifies the differential voltage to obtain an error signal while generating triangular wave having a constant cycle, and a voltage comparator compares the potential of the error signal with that of the triangular wave to obtain rectangular wave. By controlling the pulse width of this rectangular wave, the output voltage is adjusted. It is difficult to keep accuracy in such a conventional switching power supply, which is generally formed of an analog circuit, since the analog circuit has a defect of being greatly influenced by noise. Further, there is another problem that the reduction in voltage causes a trade-off between accuracy and high-speed operation, and expected performance cannot be realized.

In a digitally-controlled switch power supply proposed in order to solve these problems, an analog-digital converter converts the output power voltage into a digital value, and then comparison between the digital value and the reference voltage and phase compensation for stabilizing the operation of the control system are performed by digital arithmetic processing, in order to control the pulse width of the clock by a digital pulse-width modulator in accordance with the result.

By using digital arithmetic processing, danger of malfunction caused by noise can be avoided. Further, the benefit of the miniaturization of elements can be effectively used, which realizes a highly integrated arithmetic processing circuit operating at high speed. Therefore, the problem of the trade-off between accuracy and high-speed operation can, be solved by the digitally-controlled switching power supply.

However, in order to realize the digitally-controlled switch power supply, an analog-digital converter of high accuracy and a digital pulse-width modulator of further high accuracy are required. For example, in a voltage-reducing DC-DC converter which converts an input power-supply voltage of 10 V into an output power voltage of 1 V, when the output power voltage is to be controlled with an accuracy of 10 mV, at least an analog-digital converter having an accuracy of 7 bits and a digital pulse-width modulator having an accuracy of 10 bits are required.

Further, in order to ensure the stability of the voltage feedback control, there is a restriction that the voltage adjustment accuracy of the output power voltage Vo must be finer than the input voltage accuracy of the output power voltage Vo, which is 10 mV in this example. When this restriction is not satisfied, output potential periodically vibrates, which is a phenomenon called limit cycle leading to a defect that the output power voltage cannot be stabilized. As stated above, the digital pulse-width modulator on the output side is required to have an accuracy of several times to dozens of times higher than that required for the analog-digital converter on the input side.

Further, in recent years, the power supply device has been increasingly required to be downsized, and to operate with high accuracy, at high speed, and with high efficiency. In order to meet these requirements, it is effective to increase the switching frequency, to downsize the inductor and capacitor in the lowpass filter in the output stage, and to control the voltage through feedback control at higher speed and with higher accuracy. However, this cannot be realized without a digital pulse modulator operating at high speed, with low power consumption, and with high-accuracy. For example, when the switching cycle is 1 μs, a digital pulse-width modulator having an accuracy of 10 bits controls the pulse width with a granularity of approximately 1 ns, which is equivalent to the delay time of several gates in a highly integrated circuit widely used these days.

In order to realize a digital pulse-width modulator of high accuracy, it has been proposed to use a delay line or a voltage-controlled oscillator (VCO). However, such a component is large in circuit scale and consumes large power. Further, there is another problem that the granularity for controlling the pulse width cannot be stabilized due to the influence of the variation in supplied power-supply voltage, environmental temperature, manufacturing process, etc. In this case, the pulse width must be controlled with finer granularity considering the worst situation, which leads to a vicious circle. In other words, the problem of the granularity for controlling the pulse width of the digital pulse-width modulator is an obstruction when producing a downsized power supply device operating with high accuracy, at high speed, and with high efficiency.

Hereinafter, embodiments of the present invention will be explained referring to the drawings.

(First Embodiment)

FIG. 1 is a block diagram showing a schematic structure of a digitally-controlled switching power supply according to a first embodiment. The switching power supply of FIG. 1 has an output power CMOS switch 1 formed of a field effect transistor, an inductor 2 and a capacitor 3 forming an output power lowpass filter 15, an output power voltage detecting analog-digital converter 4, an error voltage value calculating digital subtracter 5, an output voltage feedback-controlling PID (Proportional Integral Derivative) compensator, a switching operation control signal digital pulse-width modulator 7 (DPWM: Digital Pulse Width Modulator), a synchronous clock signal oscillator 8, and a synchronization reset counter 9.

The output power voltage detecting analog-digital converter 4 converts the output power voltage Vo into a digital value. The error voltage value calculating digital subtracter 5 obtains the difference between the output power voltage Vo and a given reference voltage VREF. Based on the difference obtained by the error voltage value calculating digital subtracter 5, the output voltage feedback-controlling PID compensator 6 performs a numerical process for compensating the stability of the feedback control on the output voltage in order to generate a digital compensation signal. Based on the digital compensation signal from the output voltage feedback-controlling PID compensator 6, the switching operation control signal digital pulse-width modulator 7 modulates the pulse width of a rectangular wave to generate a control signal for controlling the operation of the output power CMOS switch 1. The synchronous clock signal oscillator 8 and the synchronization reset counter 9 are arranged to synchronize the operation of each of the output power voltage detecting analog-digital converter 4, the output voltage feedback-controlling PID compensator 6, and the switching operation control signal digital pulse-width modulator 7.

The switching power supply of FIG. 1 forms a control loop for feedback-controlling an output voltage Vo obtained by the above components 1 to 9 through the output power lowpass filter 15.

The switching operation control signal digital pulse-width modulator 7 serving as a principal component in FIG. 1 has a main clock signal counter 10; a main clock count PID output comparator 11, a multiphase clock signal phase selector 12, and an output power CMOS switch controlling SR latch 13.

The main clock signal counter 10 is reset by a reset signal RSTC outputted from the synchronization reset counter 9, and then counts the number of a main clock signal CLK<0> outputted from the synchronous clock signal oscillator 8. The main clock count PID output comparator 11 detects the timing when the count value of the main clock signal counter 10 reaches the upper 7-bit output value of the output voltage feedback-controlling PID compensator 6. The multiphase clock signal phase selector 12 receives the lower 3-bit output from the output voltage feedback-controlling PID compensator 6, and selects one clock edge from 4-phase clock signals CLK<0>, CLK<1>, CLK<2>, and CLK<3> outputted from the synchronous clock signal oscillator 8. The output power CMOS switch controlling SR latch 13 receives the reset signal RSTC from the synchronization reset counter 9 by its set terminal while receiving the output signal from the multiphase clock signal phase selector 12 by its reset terminal, and outputs an output power CMOS switch control signal/SW.

FIG. 2 is an operation waveform diagram of the switching power supply of FIG. 1. FIG. 2(a) shows the operation waveforms of an input power-supply voltage Vi (solid line), the output power voltage Vo (broken line), and an output voltage SW (solid line) of the output power CMOS switch 1. The horizontal axis represents hour, and the vertical axis represents voltage. FIG. 2(b) is an operation waveform diagram of load current Iload flowing through a load not shown in FIG. 1. The horizontal axis represents hour, and the vertical axis represents current.

First, at hour T1, the switching power supply of FIG. 1 starts its operation. The output power CMOS switch 1 momentarily operates, and its output SW becomes the input power-supply voltage Vi and then returns to ground potential again. Such operation is repeated in a constant cycle. As the number of repetition increases, the period in which the output SW from the output power CMOS switch 1 is the input power-supply voltage Vi is gradually lengthened, while the period in which the output SW is the ground potential is gradually shortened. Correspondingly, the output power voltage Vo passing through the output power lowpass filter 15 formed of the inductor 2 and the capacitor 3 gradually increases.

After that, at hour T2, the output power voltage Vo reaches a target voltage, which is a half value of the input power-supply voltage in this case. At this time, clock duty (proportion of time when the output SW is the input power-supply voltage Vi in one cycle) of the output SW from the output power CMOS switch 1 becomes approximately 50%.

After that, at hour T3, it is assumed that the load current Iload flowing through the load connected to the switching power supply of FIG. 1 suddenly increases. The inductor 2 forming the output power lowpass filter 15 has an electrical characteristic of continuously letting constant current flow therethrough, and thus current shortage is compensated by the charges stored in the capacitor 3 of the output power lowpass filter 15 and the output power voltage Vo temporarily decreases. Feedback control is performed on the output power voltage Vo, and the clock duty of the output SW from the output power CMOS switch 1 increases afterwards. Then, after switching operation is performed several times, the output power voltage Vo recovers the original set potential, and the clock duty of the SW recovers the original value of 50% at the same time.

To the contrary, at hour T4, it is assumed that the load current Iload flowing through the load connected to the switching power supply of FIG. 1 suddenly decreases. The inductor 2 forming the output power lowpass filter 15 consistently has an electrical characteristic of continuously letting constant current flow therethrough, and thus charges generated by surplus current are stored in the capacitor 3 of the output power lowpass filter 15 and the output power voltage Vo temporarily increases. The output power voltage Vo is inputted into the control loop, and the clock duty of the output SW from the output power CMOS switch 1 increases afterwards. Then, after switching operation is performed several times, the output power voltage Vo recovers the original set potential, and the clock duty of the SW recovers the original value of 50% at the same time.

As stated above, the switching power supply of FIG. 1 is a constant-voltage source for outputting the constant output power voltage Vo by feeding back the output power voltage Vo to the control loop to adjust the clock duty of the output signal SW in the switching operation depending on the output power voltage Vo. The voltage feedback control operation is performed as stated below.

First, the output power voltage Vo is converted into a digital value vo[k] by the output power voltage detecting analog-digital converter 4, and inputted into the control loop. In the control loop, the error voltage value calculating digital subtracter 5 calculates a digital error signal e[k] (=v[k]−V REF), which is equivalent to the potential difference between the output power voltage Vo and the reference voltage VREF. The output voltage feedback-controlling PID compensator 6 performs arithmetic processing such as multiplication, integration, and differentiation on this error signal e[k] in accordance with the following Formula (1) for example, in order to obtain a clock duty control signal d[k] appropriate for adjusting the voltage.

$$d[k]=b0 \cdot e[k]+b1 \cdot e[k-1]+b2 \cdot e[k-2]+a1 \cdot d[k-1]+a2 \cdot d[k-2] \quad (1)$$

In the above Formula (1), e[k−1] represents the error signal sampled most recently, and e[k−2] represents the error signal sampled secondarily recently. Similarly, d[k−1] represents the clock duty control signal obtained most recently, and d[k−2] represents the clock duty control signal obtained secondarily recently. Further, each of coefficients b0, b1, b2, a1, and a2 is a constant. Note that it is desirable that the initial value d[0] of the clock duty control signal is set to V REF/Vi.

FIG. 3 is a detailed block diagram of the output voltage feedback-controlling PID compensator 6. The output voltage feedback-controlling PID compensator 6 of FIG. 3 is formed of registers reg., multipliers xa1, xa2, xb0, xb1, and xb2, and an adder 60, and performs the arithmetic processing shown in Formula (1) on the digital error signal e[k] to output the clock duty control signal d[k] from the adder 60.

The clock duty control signal d[k] obtained by the output voltage feedback-controlling PID compensator 6 is supplied to the switching operation control signal digital pulse-width modulator 7 (DPWM). The DPWM 7 generates a switching operation control signal/SW, which is a constant rectangular clock signal having adjusted pulse width. The output power CMOS switch 1 operates in accordance with this switching operation control signal/SW to obtain a rectangular wave SW. The rectangular wave SW is smoothed by the output power lowpass filter 15 formed of the inductor 2 and the capacitor 3 to obtain the constant output power voltage Vo.

Here, calculation accuracy (number of bits) required for the digital signals and components in the control loop will be explained showing an example. First, when the output power voltage Vo[k] inputted into the output power voltage detecting analog-digital converter 4 has a digital value of 8 bits and the maximum value of the output power voltage Vo is 2.5 V, input voltage accuracy of the output power voltage is about 10 mV based on 8-bit resolution.

In order to ensure the stability of the voltage feedback control, there is a restriction that the voltage adjustment accuracy of the output power voltage Vo must be higher than the input voltage accuracy of the output power voltage Vo, which is about 10 mV in this example. When this restriction is not satisfied, output potential periodically vibrates, which is a phenomenon called limit cycle leading to a defect that the output power voltage cannot be stabilized. When the input power-supply voltage Vi is 5 V, the switching operation control signal digital pulse-width modulator 7 (DPWM) is required to have at least 9-bit resolution and desirably 10-bit resolution considering the safety, in order to control the output power voltage Vo with a granularity finer than about 10 mV. Further, as stated above, the output voltage feedback-controlling PID compensator 6 is formed of a plurality of registers and multiplication/addition computing units, and multiplication, integration, and differentiation computing is performed by their repetition processing. Therefore, in order not to accumulate calculation errors, the registers and multiplication/addition computing units are required to have an accuracy 2 times higher than that of the signal inputted thereto, which is namely 16-bit calculation accuracy. The output voltage feedback-controlling PID compensator 6 having 16-bit calculation accuracy outputs the upper 10 bits as the clock duty control signal to be inputted into the switching operation control signal digital pulse-width modulator 7. Since the switching operation control signal digital pulse-width modulator 7 (DPWM) according to the first embodiment has 10-bit resolution, adjustment accuracy of the clock duty becomes 1/1024, and the input power-supply voltage Vi up to 10 V at the maximum can be surely controlled with 10-mV control accuracy as required.

As stated above, the switching operation control signal digital pulse-width modulator 7 (DPWM) is required to have high clock duty control accuracy. Further, switching frequency has been increased recently to cover from 1 MHz to 10 MHz. This is because the inductor 2 forming the output power lowpass filter 15 can be further downsized as the switching frequency is increased, which is advantageous to downsize the device, or to meet the requirements of EMC (Electro-Magnetic Compatibility), which is namely to prevent malfunction due to electromagnetic wave. In order to control the clock duty of 1-MHz switching frequency with 10-bit resolution, it is required to adjust its clock pulse width with a granularity of about 1 ns. Further, in the case of 10-MHz switching frequency, the adjustment granularity of the clock pulse width is about 100 ps, which corresponds to the delay of merely one inverter. Conventionally, a circuit for controlling inverters connected in multiple stages, which is called a delay line, has been used in order to control the delay with a fine granularity. However, such a delay line circuit is formed of many inverters and selection circuits, and thus causes a problem that circuit scale and production cost are increased. Further, there is another problem that the amount of delay greatly varies due to the influence of the variation in manufacturing process, change in environmental temperature, and change in supplied power-supply voltage. When previously taking the variation into consideration, delay time must be controlled with further smaller granularity. As will be explained below, in the present embodiment, this problem is solved by forming the switching operation control signal digital pulse-width modulator 7 (DPWM) using multiphase clock signals outputted from the synchronous clock signal oscillator 8.

Next, the structure and operation of the synchronous clock signal oscillator 8 for generating the 4-phase clock signals CLK<0>, CLK<1>, CLK<2>, and CLK<3> will be explained in detail. FIG. 4(a) is a circuit diagram showing a detailed structure of the synchronous clock signal oscillator 8, and FIG. 4(b) is a waveform diagram of the output signals from the synchronous clock signal oscillator 8.

The synchronous clock signal oscillator 8 of FIG. 4(a) is a ring oscillator formed of 5-stage inverters. The structure can be roughly divided into three components. That is, the synchronous clock signal oscillator 8 is formed of: a VCOP&VCON bias voltage generator 81 for generating bias voltage VCOP and VCON; a ring oscillator unit 82 formed of 5-stage inverters; and a multiphase clock buffer unit 83 for amplifying the output signal from each inverter in the ring oscillator and outputting the amplified signals as multiphase clock signals.

The VCOP&VCON bias voltage generator 81 has: a voltage-dividing resistance 8-1 and a voltage-dividing variable resistance 8-2; a Vbias voltage follower differential amplifier 8-3; a Vbias+Vtn generating diode-connected N-type MOS transistor 8-4; a Vbias+Vtn generating high-resistance P-type MOS transistor 8-5; a Vbias generating source-follower-connected N-type MOS transistor 8-6; a Vbias=>Ibias voltage current converting resistance element 8-7; a first inverter switch monitor P-type MOS transistor 8-8; a VCOP bias voltage generating P-type MOS transistor 8-9; a second inverter switch monitor P-type MOS transistor 8-10; an Ibias current mirror P-type MOS transistor 8-11; an inverter switch monitor N-type MOS transistor 8-12; and a VCON bias voltage generating N-type MOS transistor 8-13.

The input power-supply voltage is divided by the voltage-dividing resistance 8-1 and the voltage-dividing variable resistance 8-2. The Vbias voltage follower differential amplifier 8-3 generates a bias voltage Vbias using the voltage divided by the resistances. The Vbias+Vtn generating diode-connected N-type MOS transistor 8-4 is a diode-connected N-type MOS transistor having the bias voltage Vbias as its source potential and generates a bias voltage Vbias+Vtn which is higher than the bias voltage Vbias by a threshold voltage Vtn of the N-type MOS transistor. The Vbias+Vtn generating high-resistance P-type MOS transistor 8-5 is a high-resistance P-type MOS transistor always in a conduction state to supply minute current from an input power supply to the Vbias+Vtn generating diode-connected N-type MOS transistor 8-4.

The Vbias generating source-follower-connected N-type MOS transistor 8-6 receives the generated bias voltage Vbias+Vtn by its gate electrode, and performs source follower operation to generate the bias voltage Vbias again. The Vbias=>Ibias voltage current converting resistance element 8-7 is connected between the source terminal of the Vbias generating source-follower-connected N-type MOS transistor 8-6 and a ground electrode, and converts the bias voltage Vbias into bias current Ibias.

The first inverter switch monitor P-type MOS transistor 8-8 is connected to the input power supply always in a conduction state, and has the same electrical characteristics as the P-type MOS transistor forming a switch unit of an inverter capable of adjusting the delay time, as will be explained later.

The VCOP bias voltage generating P-type MOS transistor 8-9 is connected between the drain terminal of the first inverter switch monitor P-type MOS transistor 8-8 and the drain terminal of the Vbias generating source-follower-connected N-type MOS transistor 8-6, and its gate terminal is diode-connected to its drain terminal to generate a bias voltage signal VCOP.

The second inverter switch monitor P-type MOS transistor 8-10 is connected to the input power supply always in a conduction state, and has the same electrical characteristics as the first inverter switch monitor P-type MOS transistor 8-8.

The Ibias current mirror P-type MOS transistor 8-11 is connected to the second inverter switch monitor P-type MOS transistor 8-10 in series, and adjusts the bias voltage signal VCOP connected to its gate terminal so that the bias voltage signal VCOP has the same current amount as the bias current Ibias flowing through the Vbias=>Ibias voltage current converting resistance element 8-7.

The inverter switch monitor N-type MOS transistor 8-12 is connected to the ground voltage always in a conduction state, and has the same electrical characteristics as the P-type MOS transistor forming a switch unit of an inverter capable of adjusting the delay time, as will be explained later.

The VCON bias voltage generating N-type MOS transistor 8-13 is connected between the drain terminal of the inverter switch monitor N-type MOS transistor 8-12 and the drain terminal of the Ibias current mirror P-type MOS transistor 8-11, and its gate terminal is diode-connected to its drain terminal to generate a bias voltage signal VCON.

The ring oscillator unit 82 is formed of: 4-stage delay time adjusting inverters 8-14a, 8-14b, 8-14c, and 8-14d; and an oscillation operation controlling NAND logic circuit 8-15 for performing NAND operation on the output signal from the inverter 8-14d and an oscillation start control signal OSC-GOp, which are connected to form a ring (loop).

Each of the delay time adjusting inverters 8-14a, 8-14b, 8-14c, and 8-14d receives power supplied from the input power supply, and is formed of: an inverter switch P-type MOS transistor 8-14-1; a current controlling P-type MOS transistor 8-14-2; an inverter switch N-type MOS transistor 8-14-3; and a current controlling N-type MOS transistor 8-14-4.

The gate terminal of the inverter switch P-type MOS transistor 8-14-1 is connected to the output signal from the inverter in the former stage. The current controlling P-type MOS transistor 8-14-2 is connected to the inverter switch P-type MOS transistor 8-14-1 in series, and its gate terminal is connected to the bias voltage signal VCOP. The inverter switch N-type MOS transistor 8-14-3 is connected to the ground electrode, and its gate terminal is connected to the output signal from the inverter in the former stage. The current controlling N-type MOS transistor 8-14-4 is connected to the inverter switch N-type MOS transistor 8-14-3 in series, and its gate terminal is connected to the bias voltage signal VCON.

The drain terminal of the current controlling P-type MOS transistor 8-14-2 and the drain terminal of the current controlling N-type MOS transistor 8-14-4 are connected to each other to generate an output signal from the delay time adjusting inverter. The output signal terminal is further connected to a P-type MOS capacitor 8-14-5 and an N-type MOS capacitor 8-14-6. The gate terminal of the P-type MOS capacitor 8-14-5 is connected to the output signal terminal of the delay time adjusting inverter, and both of its source terminal and drain terminal are connected to an external power supply. Similarly, the gate terminal of the N-type MOS capacitor 8-14-6 is connected to the output signal terminal of the delay time adjusting inverter, and both of its source terminal and drain terminal are connected to the ground electrode.

The multiphase clock buffer unit 83 is formed of 4 lines of clock buffers 8-16a, 8-16b, 8-16c, and 8-16d for receiving and amplifying the output signals from the 4-stage delay time adjusting inverters 8-14a, 8-14b, 8-14c, and 8-14d and outputting the amplified signals.

The clock buffer 8-16a receives the output signal from the delay time adjusting inverter 8-14a in the first stage, and outputs the clock signal CLK<0>. The clock buffer 8-16c receives the output signal from the delay time adjusting inverter 8-14c in the third stage, and outputs the clock signal CLK<2>. Each of the clock buffer 8-16a and the clock buffer 8-16c is formed of 2-stage inverters. Therefore, the clock signals CLK<0> and CLK<2> become approximately in phase with the output signals from the delay time adjusting inverters 8-14a and 8-14c.

On the other hand, the clock buffer 8-16b receives the output signal from the delay time adjusting inverter 8-14b in the second stage, and outputs the clock signal CLK<1>. The clock buffer 8-16d receives the output signal from the delay time adjusting inverter 8-14d in the fourth stage, and outputs the clock signal CLK<3>. Each of the clock buffer 8-16b and the clock buffer 8-16d is formed of 3-stage inverters. Therefore, the clock signals CLK<1> and CLK<3> become approximately in reverse phase with the output signals from the delay time adjusting inverters 8-14b and 8-14d.

As shown in FIG. 4(b), the synchronous clock signal oscillator 8 formed as stated above outputs the multiphase clock signals CLK<0>, CLK<1>, CLK<2>, and CLK<3> each being shifted from each other by approximately 45 degrees.

In the circuit of FIG. 4(a), the rising characteristics and falling characteristics of the delay time adjusting inverters 8-14a, 8-14b, 8-14c, and 8-14d are evenly kept, and thus the clock duty of the multiphase clock signals CLK<0>, CLK<1>, CLK<2>, and CLK<3> becomes 50%. Further, by using the rising timing and falling timing of the inverters 8-14a, 8-14b, 8-14c, and 8-14d, 8 timing points can be obtained by evenly dividing the oscillation cycle of the synchronous clock signal oscillator 8. Further, the oscillation cycle of the synchronous clock signal oscillator 8 can be easily adjusted by changing the resistance value of the voltage-dividing variable resistance 8-2. Further, the oscillation cycle is characterized in being kept approximately constant even when the input power-supply voltage varies more or less. The characteristic is ensured by the following circuit operation.

The oscillation cycle of the ring oscillator unit 82 in FIG. 4(a) is 8 times longer than the delay time of the delay time adjusting inverters 8-14a, 8-14b, 8-14c, and 8-14d, as long as the switching speed of the oscillation operation controlling NAND logic circuit 8-15, which is one of the components of the ring oscillator unit 82, is sufficiently fast. Further, by sufficiently focusing the current drive performance of the current controlling P-type MOS transistor 8-14-2 and the current controlling N-type MOS transistor 8-14-4 in the inverter on the on-state current of the inverter switch P-type MOS transistor 8-14-1 and the inverter switch N-type MOS transistor 8-14-3, delay time of the delay time adjusting inverters 8-14a, 8-14b, 8-14c, and 8-14d can be controlled by the bias voltage signals VCOP and VCON.

Here, by harmonizing: the electrical characteristics of the inverter switch P-type MOS transistor 8-14-1 with those of the first inverter switch monitor P-type MOS transistor 8-9; the electrical characteristics of the current controlling P-type MOS transistor 8-14-2 with those of the VCOP bias voltage generating P-type MOS transistor 8-9; the electrical characteristics of the inverter switch N-type MOS transistor 8-14-3 with those of the inverter switch monitor N-type MOS transistor 8-12; and the electrical characteristics of the current controlling N-type MOS transistor 8-14-4 with those of the VCON bias voltage generating N-type MOS transistor 8-13, current driving force of the delay time adjusting inverters 8-14a, 8-14b, 8-14c, and 8-14d becomes equivalent to the bias current Ibias flowing through the Vbias=>Ibias voltage current converting resistance element 8-7. Further, when the input power-supply voltage is represented as Vi and the total capacity applied to the output terminals of the delay time adjusting inverters 8-14a, 8-14b, 8-14c, and 8-14d is represented as Cinv, delay time τ inv of the delay time adjusting inverters 8-14a, 8-14b, 8-14c, and 8-14d can be expressed as in the following Formula (2).

$$\tau_{inv} = \frac{C_{inv} \cdot V_i}{2 \cdot I_{bias}} \quad (2)$$

The bias current Ibias flowing through the Vbias=>Ibias voltage current converting resistance element 8-7, which is one of the components of the VCOP&VCON bias voltage generator 81, can be defined as shown in the following Formula (3) using its resistance value Rbias, a resistance value Ra of the voltage-dividing resistance 8-1, a resistance value Rb of the voltage-dividing variable resistance 8-2, and the input power-supply voltage Vi.

$$I_{bias} = \frac{R_b}{R_a + R_b} \times V_i \times \frac{1}{R_{bias}} \quad (3)$$

Based on Formula (2) and Formula (3), the delay time τ inv of the delay time adjusting inverters 8-14a, 8-14b, 8-14c, and 8-14d can be defined as shown in the following formula using only resistance values serving as circuit constants, regardless of the input power-supply voltage Vi.

$$\tau_{inv} = C_{inv} \times R_{bias} \times \frac{R_a + R_b}{2 \times R_b} \quad (4)$$

The oscillation cycle of the synchronous clock signal oscillator 8 is 8 times longer than the delay time τ inv of the delay time adjusting inverters 8-14a, 8-14b, 8-14c, and 8-14d, and the delay time τ inv can be easily adjusted by changing the resistance value Rb of the voltage-dividing variable resistance 8-2, as shown in Formula (3).

Further, the oscillation cycle 8×τ inv is ideally kept constant regardless of the input power-supply voltage Vi. Actually, operation delay time of the inverter switch P-type MOS transistor 8-14-1, the inverter switch N-type MOS transistor 8-14-3, and the oscillation operation controlling NAND logic circuit 8-15 is additionally included. The operation delay time is influenced by the variation in the input power-supply voltage, temperature, and manufacturing process, and thus the oscillation cycle of the synchronous clock signal oscillator 8 slightly varies. However, even in such a case, the multiplication relationship between the oscillation cycle 8×τ inv of the synchronous clock signal oscillator 8 and the delay time τ inv of the delay time adjusting inverters 8-14a, 8-14b, 8-14c, and 8-14d does not change.

What is important for the accuracy required for the switching operation control signal digital pulse-width modulator 7 (DPWM) is not to control the pulse time itself but to control the duty of the pulse width. In a digital pulse-width modulator using a conventional delay line, it is difficult to ensure the accuracy of the digital pulse-width modulator since the oscillation cycle and delay time of the clock vary separately. On the other hand, according to the present embodiment, the relationship between the oscillation cycle and delay time of the clock is kept constant, and thus the accuracy of the switching operation control signal digital pulse-width modulator 7 is kept high without being influenced by the variation in the input power-supply voltage, temperature, and manufacturing process.

Next, the structure of the multiphase clock signal phase selector 12, which is a particularly important component of the switching operation control signal digital pulse-width modulator, will be explained in detail. FIG. 5 is a circuit diagram showing a detailed structure of the multiphase clock signal phase selector 12.

The multiphase clock signal phase selector 12 of FIG. 5 has: a clock selector 12-1; a non-inverted clock selector 12-2; an inverted clock selector 12-3; a dx latch-and-hold buffer 12-4; a dxx latch-and-hold buffer 12-5; a dxxx latch-and-hold buffer 12-6; a non-inverted clock gating circuit 12-7; an inverted clock gating circuit 12-8; and a clock gating OR logic circuit 12-9.

The clock selector 12-1 selects one of the multiphase clock signals CLK<0>, CLK<1>, CLK<2>, and CLK<3> from the synchronous clock signal oscillator 8 in accordance with a lower 2nd bit signal d<1> and a least significant bit signal d<0> of the output signal d[k] (k is an integer showing the number of sampling times) from the output voltage feedback-controlling PID compensator 6.

When a lower 3rd bit signal d<2> of the output signal d[k] from the output voltage feedback-controlling PID compensator 6 is 0, the non-inverted clock selector 12-2 outputs a non-inverted clock signal CLKt based on the output clock signal from the clock selector 12-1.

When the lower 3rd bit signal d<2> of the output signal d[k] from the output voltage feedback-controlling PID compensator 6 is 1, the inverted clock selector 12-3 outputs an inverted clock signal CLKc based on the output clock signal from the clock selector 12-1.

The dx latch-and-hold buffer 12-4 receives a result d_match of the main clock count PID output comparator 11, acquires its value at the rising timing of the main clock signal CLK<0>, retains the value for 1 cycle period of the main clock signal CLK<0>, and outputs a dx signal. The dxx latch-and-hold buffer 12-5 receives the dx signal, acquires its value at the rising timing of the clock signal CLK<3> having a phase delayed by 135°, retains the value for 1 cycle period of the clock signal CLK<3> having a phase delayed by 135°, and outputs a dxx signal. The dxxx latch-and-hold buffer 12-6 receives the dxx signal, and outputs a signal dxxx having a phase delayed by a half cycle period of the clock signal CLK<3> having a phase delayed by 135°.

The non-inverted clock gating circuit 12-7 receives the dxx signal, acquires its value at the rising timing of the non-inverted clock signal CLKt, retains the state while the non-inverted clock signal CLKt is 1, and outputs a non-inverted reset signal RSTt.

The inverted clock gating circuit 12-8 receives the dxxx signal, acquires its value at the rising timing of the inverted clock signal CLKc, retains the state while the inverted clock signal CLKc is 1, and outputs an inverted reset signal RSTc.

The clock gating OR logic circuit 12-9 receives the non-inverted reset signal RSTt and the inverted reset signal RSTc, and outputs a reset signal reset which has a value of 1 when one of the received signals is 1.

Figure 6:
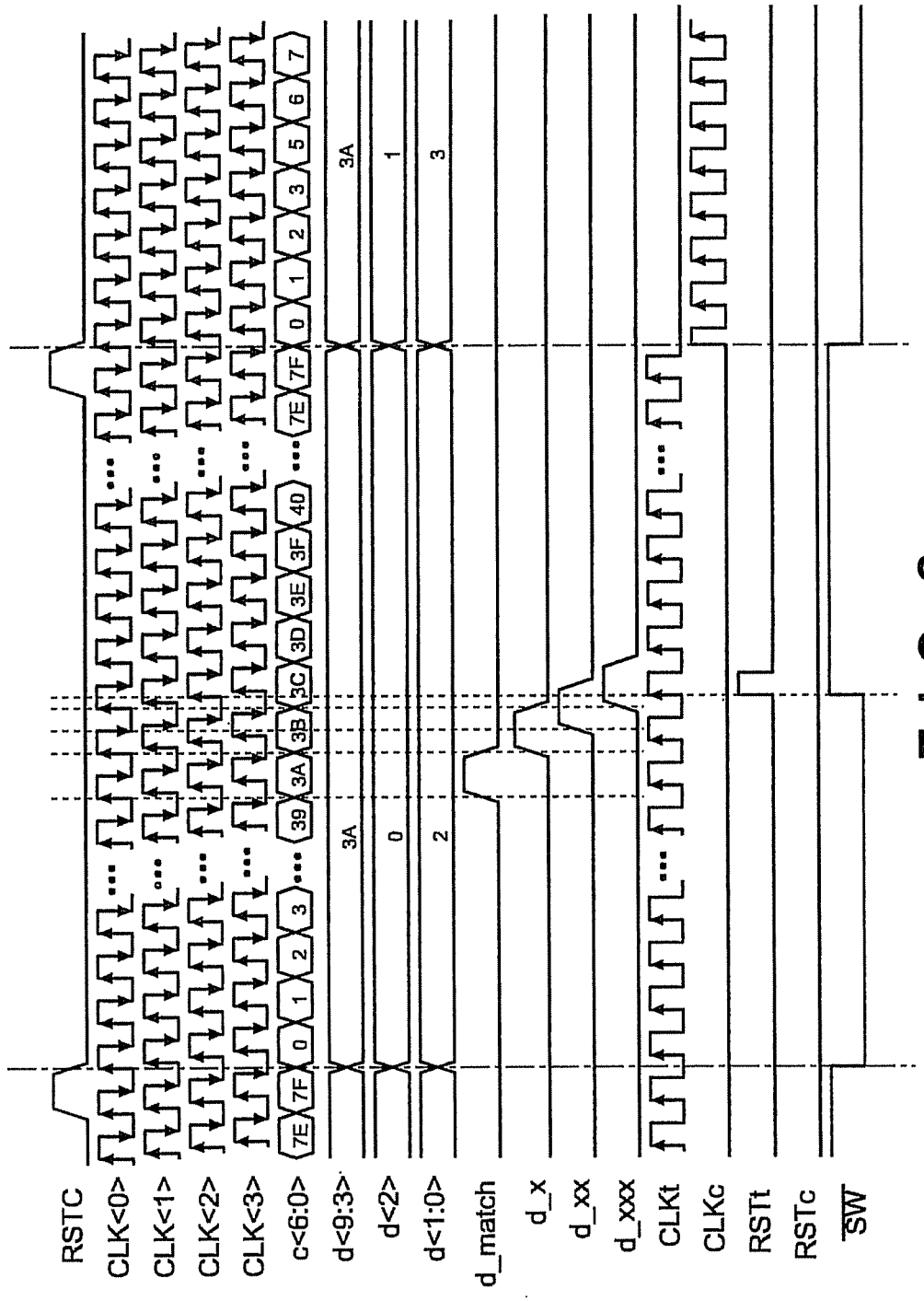
FIG. 6 is a waveform diagram of a switching operation control signal digital pulse-width modulator 7.

FIG. 6 is a waveform diagram of the switching operation control signal digital pulse-width modulator 7. Hereinafter, the operation of the switching operation control signal digital pulse-width modulator 7 will be explained using FIG. 1, FIG. 5 and FIG. 6. The switching operation control signal digital pulse-width modulator 7 starts its operation when receiving the reset signal RSTC from the synchronization reset counter 9.

When receiving the reset signal RSTC, the output power CMOS switch controlling SR latch 13 is set first, and the output power CMOS switch control signal SW is activated. Further, the main clock signal counter 10 is reset, and a main clock counter output c<6:0> becomes 0 at the next rising timing of the main clock CLK<0>. After that, the main clock counter output c<6:0> is counted up one by one at the rising timing of the main clock CLK<0>.

On the other hand, output signals d<9:3>, d<2>, and d<1:0> are given from the output voltage feedback-controlling PID compensator 6 at the timing when the main clock counter output c<6:0> becomes 0, and d<9:3> showing the upper 7 bits has a value of 3A in hexadecimal, d<2> showing the lower 3rd bit has a value of 0, and d<1:0> showing the lower 2nd bit and least significant bit has a value of 2.

The main clock count PID output comparator 11 compares the main clock counter output c<6:0> with d<9:3> showing the upper 7 bits of the output signal from the output voltage feedback-controlling PID compensator 6, and activates the match signal d_match at the timing when those values become the same. The match signal d_match is acquired by the dx latch-and-hold buffer 12-4 in the multiphase clock signal phase selector 12 at the next rising timing of the main clock CLK<0>, retained therein, and converted into the dx signal. The state change of the dx signal is delayed by the dxx latch-and-hold buffer 12-5 until the falling timing of the main clock signal CLK<0>, and the dx signal is converted into the dxx signal. Further, the state change of the dxx signal is delayed by the dxxx latch-and-hold buffer 12-6 until the next rising timing of the main clock signal CLK<0>, and the dxx signal is converted into the dxxx signal.

On the other hand, d<1:0> showing the lower 2nd bit and least significant bit of the output signal from the output voltage feedback-controlling PID compensator 6 is used as a selection signal of the clock selector 12-1, and based on its bit string value, one of the multiphase (4-phase) clock signals CLK<0>, CLK<1>, CLK<2>, and CLK<3> is selected. Further, d<2> showing the lower 3rd bit of the output signal from the output voltage feedback-controlling PID compensator 6 is used as a selection signal of the non-inverted clock selector 12-2 and the inverted clock selector 12-3, and the non-inverted clock CLKt is outputted when its value is 0 while the inverted clock CLKc is outputted when its value is 1.

In the example shown in FIG. 6, d<1:0> showing the lower 2nd bit and least significant bit of the output signal from the output voltage feedback-controlling PID compensator 6 is 2, and bit d<2> showing the lower 3rd bit is 0, and thus the clock signal CLK<2> delayed by 90° is selected to generate the non-inverted clock CLKt. Further, in the latter part of FIG. 6, d<1:0> showing the lower 2nd bit and least significant bit of the output signal from the output voltage feedback-controlling PID compensator 6 is 3, and d<2> showing the lower 3rd bit is 1, and thus the clock signal CLK<3> delayed by 135° is selected to generate the inverted clock CLKc. Note that this inverted clock CLKc can be regarded as a clock signal delayed by 315°. The non-inverted clock CLKt is supplied to the non-inverted clock gating circuit 12-7, and the inverted clock CLKc is supplied to the inverted clock gating circuit 12-8.

The non-inverted clock gating circuit 12-7 is inputted with the dxx signal. The non-inverted clock gating circuit 12-7 acquires the dxx signal at the rising timing of the non-inverted clock CLKt, retains the state while the non-inverted clock CLKt is 1, and outputs the non-inverted reset signal RSTt. In other words, the non-inverted clock gating circuit 12-7 can be regarded as a single clock gating circuit for generating the non-inverted reset signal RSTt using the non-inverted clock signal CLKt supplied only when the dxx signal is activated.

Similarly, the inverted clock gating circuit 12-8 is inputted with the dxxx signal. The inverted clock gating circuit 12-8 acquires the dxxx signal at the rising timing of the inverted clock CLKc, retains the state while the inverted clock CLKc is 1, and outputs the inverted reset signal RSTc. In other words, the inverted clock gating circuit 12-8 can be regarded as a single clock gating circuit for generating the inverted reset signal RSTc using the inverted clock signal CLKc supplied only when the dxxx signal is activated.

The generated non-inverted reset signal RSTt and inverted reset signal RSTc are synthesized by the clock gating OR logic circuit 12-9, and the output power CMOS switch control signal SW is deactivated at the timing when one of them is activated.

In the example of FIG. 6, when the main clock signal counter 10 counts 7F in hexadecimal, the reset signal RSTC is inputted again, and the counter output signal c<6:0> is reset to 0. By repeating this operation, the switching operation control signal digital pulse-width modulator 7 controls the clock duty of its output, which is namely the output power CMOS switch control signal SW, by the output signal d supplied from the output voltage feedback-controlling PID compensator 6, based on 10-bit accuracy.

Here, as explained above, the delay time $\tau$ inv of the multiphase clock signals CLK<0>, CLK<1>, CLK<2>, and CLK<3> outputted from the synchronous clock signal oscillator 8 is determined by the circuit constant in the synchronous clock signal oscillator 8 and thus kept constant and stable relatively without being influenced by the variation in the input power-supply voltage Vi, environmental temperature, and process. Even if the delay time $\tau$ inv is affected by these influences and varies more or less, the oscillation cycle of the synchronous clock signal oscillator 8 is 8 times longer than the delay time $\tau$ inv, and the relative relationship does not change. In other words, the switching operation control signal digital pulse-width modulator 7 (DPWM) formed in this way can stably control the clock duty of its output, which is namely the output power CMOS switch control signal SW, with 10-bit accuracy.

As stated above, the multiphase clock signal phase selector 12 shown in FIG. 5 selects one of the multiphase (4-phase) clock signals CLK<0>, CLK<1>, CLK<2>, and CLK<3> based on the bit value of d<1:0> showing the lower 2 bits of the output signal from the PID compensator 6. This makes it possible only to select a signal having a phase shifted on a 90-degree basis. As a technique for selecting multiphase clock signals each having a smaller phase difference, the structure of the multiphase clock signal phase selector 12 can be changed.

Figure 7:
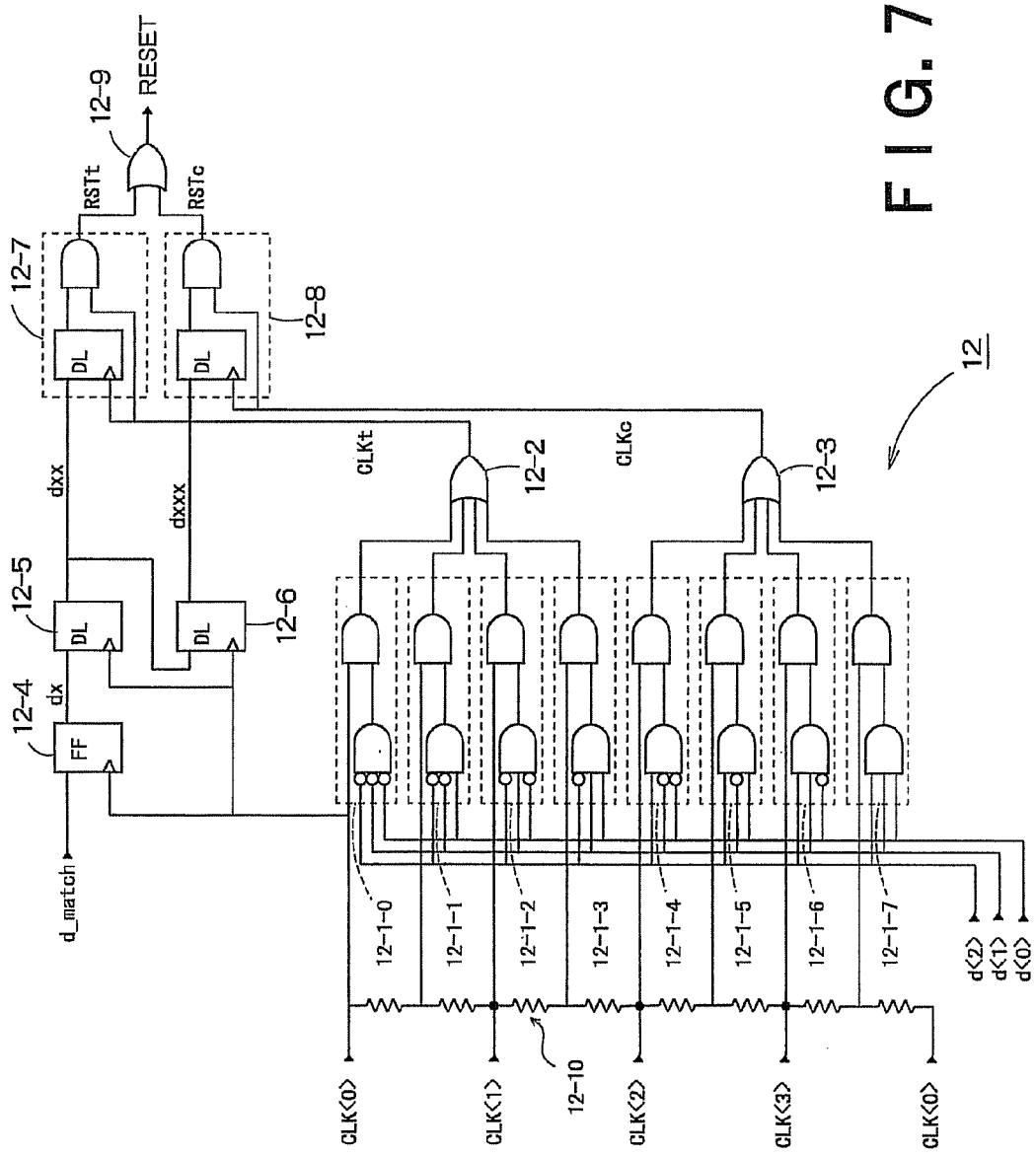
FIG. 7 is a circuit diagram showing a detailed structure of a modification example of the multiphase clock signal phase selector 12.

FIG. 7 is a circuit diagram showing a detailed structure of a modification example of the multiphase clock signal phase selector 12. The multiphase clock signal phase selector 12 of FIG. 7 has a phase interpolation resistances 12-10 for generating multiphase clock signals each having a smaller phase difference, using the multiphase (4-phase) clock signals CLK<0>, CLK<1>, CLK<2>, and CLK<3>. A plurality of phase interpolation resistances 12-10 (2 resistances in the case of FIG. 7) are connected in series between two multiphase clock signals adjacent to each other, and a new multiphase clock signal is outputted between the resistances adjacent to each other.

By arranging the phase interpolation resistances 12-10, totally 8 multiphase clock signals including the above multiphase (4-phase) clock signals CLK<0>, CLK<1>, CLK<2>, and CLK<3> are generated, and the phase difference between adjacent multiphase clock signals becomes 45 degrees.

The totally 8 multiphase clock signals generated by the phase interpolation resistances 12-10 are selected based on the bit value of d<2:0> showing the lower 3rd bit of the output signal from the PID compensator 6. In order to perform this selection, arranged in the stage following the phase interpolation resistances 12-10 are 8 unit clock selectors 12-1-0 to 12-1-7 formed of: decoders each detecting the correspondence with the bit value of d<2:0>; and 8 AND logic circuits each generating a logical product signal of the selection signal and the multiphase clock signal using this decoder. The clock signals selected by these unit clock selectors 12-1-0 to 12-1-7 are inputted into OR logic circuits 12-2 and 12-3. The OR logic circuits 12-2 and 12-3 output the clock signals CLKt and CLKc respectively.

By using the multiphase clock signal phase selector 12 of FIG. 7 instead of that of FIG. 5, the phase of the switching operation control signal/SW of the output power CMOS switch 1 can be controlled more precisely, and the output power voltage Vo can be controlled with high accuracy and at high speed.

Further, according to the present embodiment, since the control loop of the output power voltage Vo can be formed entirely by digital signal processing, downsizing is possible and thus a highly efficient switching power supply can be realized with low cost.

(Second Embodiment)

A second embodiment is made to increase accuracy by using greater number of bits in some signals compared to the first embodiment. The second embodiment is similar to the first embodiment except in increasing the number of bits, and thus differences from the first embodiment will be mainly explained hereinafter.

FIG. 8 is a block diagram showing a schematic structure of a digitally-controlled switching power supply according to the second embodiment. Since the configuration of FIG. 8 is similar to that of FIG. 1, the same symbols as those of FIG. 1 are used.

FIG. 8 is different from FIG. 1 in that the accuracy of the digital output signal vo[k] from the output power voltage detecting analog-digital converter 4 is increased from 8 bits to 9 bits, and that the accuracy of the duty control signal d[k] to the switching operation control signal digital pulse-width modulator 7 is increased from 10 bits to 11 bits. Accordingly, in the second embodiment, the voltage of the output power can be controlled with higher accuracy compared to the first embodiment.

Here, considering the structure of the switching operation control signal digital pulse-width modulator 7 in detail, the accuracy of the duty control signal d[k] directed to the main clock count PID output comparator 11 remains 7 bits, but the accuracy of the duty control signal d[k] directed to the multiphase clock signal phase selector 12 is increased from 3 bits to 4 bits.

As a method for improving the duty control accuracy of the switching operation control signal digital pulse-width modulator 7 excepting the method of the present embodiment, it is possible to increase the accuracy of the duty control signal d[k] directed to the main clock count PID output comparator 11 from 7 bits to 8 bits without changing the 3-bit accuracy of the duty control signal d[k] directed to the multiphase clock signal phase selector 12. However, in this technique, the maximum value of the main clock signal counter 10 becomes 2 times greater compared to the first embodiment, and thus the switching frequency is halved. In order to restrain the voltage ripple of the output power voltage Vo caused by this phenomenon, the product of the circuit constants of the inductor 2 forming the output power lowpass filter 15 and the capacitor 3 forming the output power lowpass filter 15 must be made doubled. This leads to the increases in the size of the power supply device, and to the increases in cost. In addition, deterioration in EMC (Electro-Magnetic Compatibility) characteristics is caused as a penalty. It is possible to double the oscillation frequency the synchronous clock signal oscillator 8 to prevent the deterioration, but current consumed by the synchronous clock signal oscillator 8 and the main clock signal counter 10 etc. serving as the circuits for receiving the clock signal is increased. Further, control on the oscillation frequency of the synchronous clock signal oscillator 8 and the delay time τ inv of the multiphase clock signals CLK<0>, CLK<1>, CLK<2>, and CLK<3> is deteriorated, which leads to a dilemma that the control accuracy of the output power voltage cannot be improved as expected.

In the present embodiment, the accuracy of the duty control signal d[k] directed to the main clock count PID output comparator 11 remains 7 bits, and thus disadvantages caused by increasing the clock frequency, such as the halved switching frequency, are not generated. In addition, the present embodiment is characterized in that the multiphase clock signals CLK<0>, CLK<1>, CLK<2>, and CLK<3> inputted into the multiphase clock signal phase selector 12 remain 4-phase signals although the accuracy of the duty control signal d[k] directed to the multiphase clock signal phase selector 12 is increased from 3 bits to 4 bits.

FIG. 9 is a circuit diagram showing a detailed structure of the multiphase clock signal phase selector 12 applied to the present embodiment. Since the schematic structure and operation of FIG. 9 are similar to FIG. 5, the same symbols are assigned to common components and overlapping explanation will be omitted.

FIG. 9 is different from FIG. 5 only in the structure of the clock selector 12-1. The multiphase clock signal phase selector 12 employed in the present embodiment has 16 kinds of unit clock selectors 12-1-0, 12-1-2, . . . , 12-1-9, 12-1-a, 12-1-b, . . . and 12-1-f each formed of: a decoder for a 4-bit duty control signal d<3:0>; and an AND logic circuit for selecting a clock signal from the output signal from the decoder.

Figure 10:
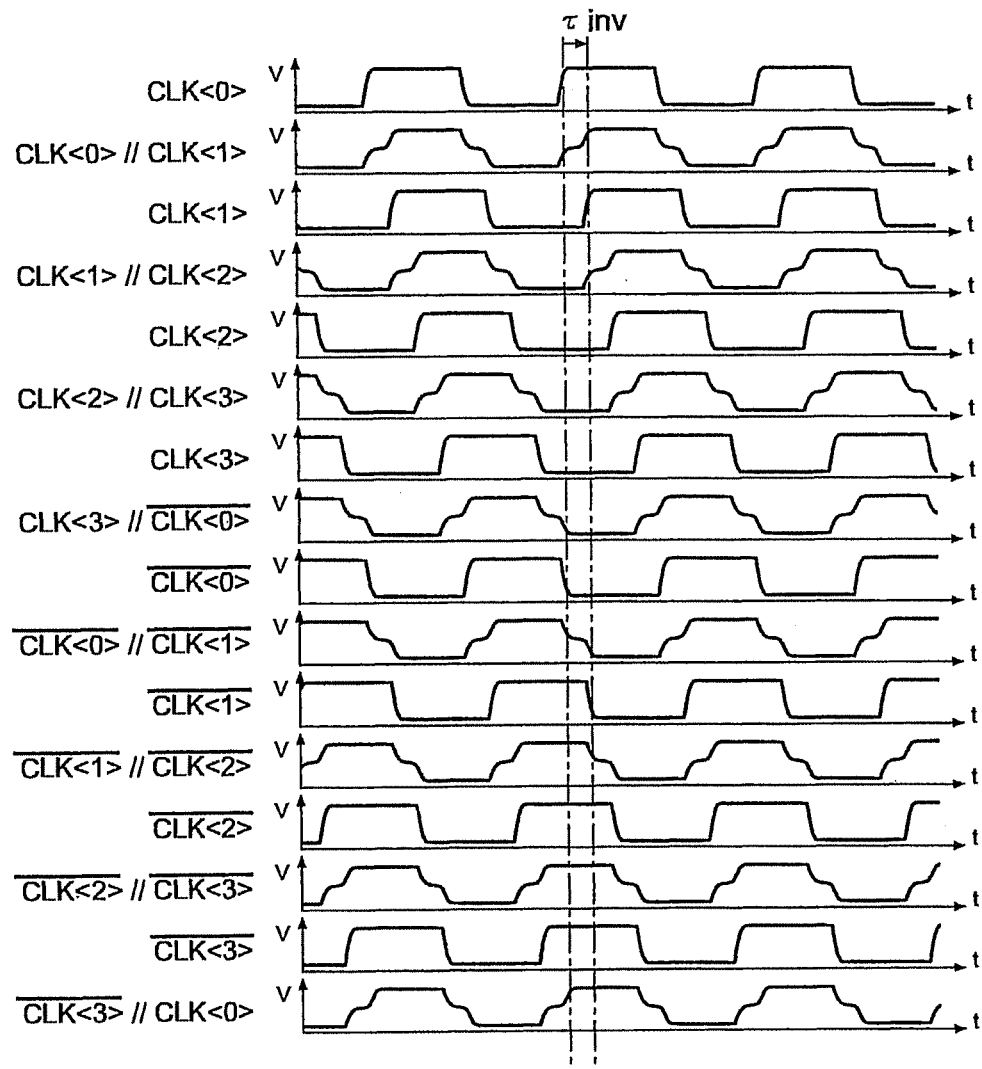
FIG. 10 is a signal waveform diagram of each clock signal generated by each AND logic circuit and wired-OR connection between the AND logic circuits.

The outputs from the AND logic circuits are wired-OR connected, which makes it possible to generate an intermediate phase clock signal by synthesizing a plurality of clock signals. FIG. 10 is a signal waveform diagram of each clock signal outputted from each AND logic circuit and each clock signal generated by wired-OR connection between the AND logic circuits. In FIG. 10, for example, CLK<0>//CLK<1> is a signal generated by the wired-OR connection between the clock signals CLK<0> and CLK<1>, in which rising and falling waveform is gradual and an intermediate phase is generated.

In FIG. 5, the clock selector 12-1 of the multiphase clock signal phase selector 12 selects one of the 4-phase clock signals CLK<0>, CLK<1>, CLK<2>, and CLK<3> delayed from each other by 45° based on the bit value of the duty control signal d<1:0> showing the lower 2 bits. On the other hand, the clock selector 12-1 in the present embodiment, totally 8 clock signals consisting of the 4-phase clock signals CLK<0>, CLK<1>, CLK<2>, and CLK<3> and their inverted clock signals are used, and an intermediate phase clock signal is generated by synthesizing two clock signals having phases adjacent to each other. Then, one of the totally 16 kinds of clock signals is selected in accordance with the bit value of the 4-bit duty control signal d<3:0>.

For example, when the value of the duty control signal d<3:0> is 0, the unit clock selector 12-1-0 is activated to select the main clock CLK<0>, and the non-inverted clock signal CLKt having a phase which is not delayed from the main clock CLK<0> is generated through the non-inverted clock selector 12-2. Further, when the value of the duty control signal d<3:0> is 12, which is expressed as C in hexadecimal, the unit clock selector 12-1-c is activated to select the inverted signal of CLK<2> having a phase difference of 90°, and the non-inverted clock signal CLKc having a phase delayed from the main clock CLK<0> by 270° is generated through the inverted clock selector 12-3. Further, when the value of the duty control signal d<3:0> is 1, the unit clock selector 12-1-1 is activated to select the clock signal CLK<1> having a phase delayed from the main clock signal CLK<0> by 45°, and the selected signal is supplied to each AND logic circuit. The outputs from those two AND logic circuits are wired-connected (short-circuited), and the non-inverted clock signal CLKt having a phase delayed from the main clock CLK<0> by 22.5° is generated through the non-inverted clock selector 12-2. Similarly, when the value of the duty control signal d<3:0> is an odd number, any one of the unit clock selectors 12-1-1, 12-1-3, 12-1-5, 12-1-7, 12-1-9,12-1-b, 12-1-c, and 12-1-e corresponding to the odd number is activated to select adjacent two clock signals connected thereto, and a synthesized clock signal of the two clock signals is outputted. If the delay time τ inv between the adjacent clock signals is appropriately short, the delay time of the synthesized clock signal is becomes τ inv2 (halved), as shown in FIG. 10.

In addition to totally 8 kinds of waveforms of the 4-phase clock signals CLK<0>, CLK<1>, CLK<2>, and CLK<3> each having a phase shifted by 45° from each other and their inverted clock signals /CLK<0>, /CLK<1>, /CLK<2>, and /CLK<3>, FIG. 10 also shows totally 8 kinds of waveforms of the synthesized signals each generated by wired-connecting two adjacent clock signals (for example, CLK<0>//CLK<1> is a synthesized signal of CLK<0> and CLK<1>, and CLK<3>///CLK<0> is a synthesized signal of CLK<3> and the inverted signal of CLK<0>).

As explained above, in the second embodiment, the number of bits is increased in some signals compared to the first embodiment, but intermediate phase signals are generated without greatly increasing the circuit components by using wired-OR connection etc. Accordingly, the accuracy of the output power voltage of the switching power supply can be improved while hardly increasing cost and power consumption.

(Third Embodiment)

A third embodiment is different from the second embodiment in the method for generating the multiphase clock signals CLK<0>, CLK<1>, CLK<2>, and CLK<3>, and the internal structure of the multiphase clock signal phase selector 12. Since the schematic structure of the third embodiment is the same as FIG. 8, overlapping explanation will be omitted.

FIG. 11 is a circuit diagram showing, a detailed structure of the synchronous clock signal oscillator 8 according to the third embodiment. FIG. 11 is different from FIG. 4 in the positions from which the multiphase clock signals CLK<0>, CLK<1>, CLK<2>, and CLK<3> are outputted after being generated by the ring oscillator unit 82. The other components are similar to FIG. 4, and thus the same symbols are assigned thereto.

The synchronous clock signal oscillator 8 of FIG. 11 is characterized in that the control accuracy of the output power is improved by equalizing the phase delay of each of the multiphase clock signals CLK<0>, CLK<1>, CLK<2>, and CLK<3>.

The synchronous clock signal oscillator 8 used in the present embodiment outputs the multiphase clock signals CLK<0>, CLK<1>, CLK<2>, and CLK<3> each having a phase shifted by 90° from each other. In the above first and second embodiments, 8 clock signals each having a different phase are generated in one cycle using both of the rising edge and falling edge of each multiphase clock signal having a phase shifted by 45° from each other. In the present embodiment, 4 clock signals each having a different phase are generated using only the rising edge.

More concretely, the synchronous clock signal oscillator 8 according to the present embodiment generates: the main clock CLK<0> and the CLK<2> having a phase delayed by 180° based on an output OSC0 from a first delay time adjusting inverter 8-14a in the ring oscillator unit 82, using a first clock buffer 8-16a and a third clock buffer 8-16a' for reversing the phase; and CLK<1> having a phase delayed by 90° and CLK<3> having a phase delayed by 270° based on an output OSC2 from a third delay time adjusting inverter 8-14c, using a second clock buffer 8-16c and a third clock buffer 8-16c' for reversing the phase.

The first and the second embodiment are superior to the present embodiment in terms of the granularity level of delay control, but the present embodiment is superior in capable of equalizing the granularity of delay control by using only the rising edge. Hereinafter, the reason will be explained using FIG. 12.

FIG. 12 shows the waveforms of outputs OSC0, OSC1, OSC2, and OSC3 from the four delay time adjusting inverters 8-14a, 8-14b, 8-14c, and 8-14d. FIG. 12(a) shows a case where rising time and falling time are balanced, and FIG. 12(b) shows a case where rising time is long while falling time is short.

In each of the first, second, and present embodiments, the synchronous clock signal oscillator 8 adjusts the delay time by controlling the bias voltage signals VCOP and VCON using the VCOP&VCON bias voltage generator 81 so that the rising time and falling time in the delay time adjusting inverter 8-14 are equal to each other. However, it is actually difficult to make the rising time and falling time completely equal to each other. In the present embodiment, even when the rising time and falling time are imbalanced as shown in FIG. 12(b), the phase difference of each of the multiphase clock signals CLK<0>, CLK<1>, CLK<2>, and CLK<3> is always kept 90° by using only the output OSC0 from the first delay time adjusting inverter 8-14a and the output OSC2 from the third delay time adjusting inverter 8-14c.

Further, the multiphase clock signal phase selector 12 used in the present embodiment generates intermediate phase clock signals similarly to FIG. 9 while employing a structure different from FIG. 9. FIG. 13 is a circuit diagram showing a detailed structure of the multiphase clock signal phase selector 12 according to the third embodiment. The multiphase clock signal phase selector 12 of FIG. 13 has the phase interpolation resistances 12-10 for generating clock signals each having a smaller phase difference, using the multiphase clock signals CLK<0>, CLK<1>, CLK<2>, and CLK<3> each having a phase shifted by 90° from each other. A plurality of phase interpolation resistances 12-10 are connected in series between two clock signals adjacent to each other, and an intermediate timing clock signal is generated from each node.

FIG. 13 is similar to FIG. 7 explained as a modification example of the first embodiment in that the phase interpolation resistances 12-10 are arranged, but FIG. 7 produces lower accuracy than FIG. 13 since only two resistances are connected in series between two adjacent clock signals. In FIG. 9, three resistances are connected in series. Accordingly, it is possible to increase the number of intermediate phase clock signals compared to FIG. 7, and as a result, it is possible to generate totally 16 clock signals to be selected by d<3:0> showing the lower 4 bits of the output signal from the PID compensator 6.

The other components are similar to those of the multiphase clock signal phase selector 12 employed in the first embodiment and the second embodiment.

As explained above, according to the third embodiment, accuracy as in the second embodiment can be obtained. Further, similarly to the second embodiment, the increase in cost and power consumption is not caused.

(Fourth Embodiment)

A fourth embodiment is made to increase the number of clock signals to be selected by the multiphase clock signal phase selector 12 by arranging a multiphase clock signal phase interpolator.

FIG. 14 is a block diagram showing a schematic structure of a digitally-controlled switching power supply according to the fourth embodiment. FIG. 14 is similar to FIG. 8 except in that a multiphase clock signal phase interpolator 14 is newly added to the switching operation control signal digital pulse-width modulator 7, and thus the same symbols are assigned to common components. Hereinafter, differences from the third embodiment will be mainly explained.

The multiphase clock signal phase interpolator 14 is inserted between the synchronous clock signal oscillator 8 and the multiphase clock signal phase selector 12.

FIG. 15 is a circuit diagram showing a detailed structure of the multiphase clock signal phase interpolator 14. The multiphase clock signal phase interpolator 14 generates 16-phase clock signals each having a small phase difference of 22.5°, based on the multiphase clock signals CLK<0>, CLK<1>, CLK<2>, and CLK<3> each generated by the synchronous clock signal oscillator 8 to have a phase delayed by 90° from each other. As shown in FIG. 15, the multiphase clock signal phase interpolator 14 is formed of roughly three components: a VP&VN bias voltage generator 141; four delay time adjusting buffer units 142; and a phase interpolator 143.

The VP&VN bias voltage generator 141 has: a voltage-dividing resistance 14-1 and a voltage-dividing variable resistance 14-2; a Vbias voltage follower differential amplifier 14-3; a Vbias+Vtn generating diode-connected N-type MOS transistor 14-4; a Vbias+Vtn generating high-resistance P-type MOS transistor 14-5; a Vbias generating source-follower-connected N-type MOS transistor 14-6; a Vbias=>Ibias voltage current converting resistance element 14-7; a first inverter switch monitor P-type MOS transistor 14-8; a VP bias voltage generating P-type MOS transistor 14-9; a second inverter switch monitor P-type MOS transistor 14-10; an Ibias current mirror P-type MOS transistor 14-11; an inverter switch monitor N-type MOS transistor 14-12; and a VN bias voltage generating N-type MOS transistor 14-13.

Similarly to the VCOP&VCON bias voltage generator 81 of the synchronous clock signal oscillator 8, the input power-supply voltage is divided by the voltage-dividing resistance 14-1 and the voltage-dividing variable resistance 14-2. The Vbias voltage follower differential amplifier 14-3 generates a bias voltage Vbias using the voltage divided by the resistances.

The Vbias+Vtn generating diode-connected N-type MOS transistor 14-4 is a diode-connected N-type MOS transistor having the bias voltage Vbias as its source potential and generates a bias voltage Vbias+Vtn which is higher than the bias voltage Vbias by a threshold voltage Vtn of the N-type MOS transistor.

The Vbias+Vtn generating high-resistance P-type MOS transistor 14-5 is a high-resistance P-type MOS transistor always in a conduction state to supply minute current from an input power supply to the Vbias+Vtn generating diode-connected N-type MOS transistor 14-4. The Vbias generating source-follower-connected N-type MOS transistor 14-6 receives the bias voltage Vbias+Vtn by its gate electrode, and performs source follower operation to generate the bias voltage Vbias again.

The Vbias=>Ibias voltage current converting resistance element 14-7 is connected between the source terminal of the Vbias generating source-follower-connected N-type MOS transistor 14-6 and a ground electrode, and converts the bias voltage Vbias into bias current Ibias.

The first inverter switch monitor P-type MOS transistor 14-8 is connected to the input power supply always in a conduction state, and has the same electrical characteristics as the P-type MOS transistor forming a switch unit of an inverter capable of adjusting the delay time, as will be explained later.

The VP bias voltage generating P-type MOS transistor 14-9 is connected between the drain terminal of the first inverter switch monitor P-type MOS transistor 14-8 and the drain terminal of the Vbias generating source-follower-connected N-type MOS transistor 14-6, and its gate terminal is diode-connected to its drain terminal to generate a bias voltage signal VP.

The second inverter switch monitor P-type MOS transistor 14-10 is connected to the input power supply always in a conduction state, and has the same electrical characteristics as the first inverter switch monitor P-type MOS transistor 14-8.

The Ibias current mirror P-type MOS transistor 14-11 is connected to the second inverter switch monitor P-type MOS transistor 14-10 in series, and adjusts the bias voltage signal VCOP connected to its gate terminal so that the bias voltage signal VCOP has the same current amount as the bias current Ibias flowing through the Vbias=>Ibias voltage current converting resistance element 14-7.

The inverter switch monitor N-type MOS transistor 14-12 is connected to the ground voltage always in a conduction state, and has the same electrical characteristics as the P-type MOS transistor forming a switch unit of an inverter capable of adjusting the delay time, as will be explained later.

The VN bias voltage generating N-type MOS transistor 14-13 is connected between the drain terminal of the inverter switch monitor N-type MOS transistor 14-12 and the drain terminal of the Ibias current mirror P-type MOS transistor 14-11, and its gate terminal is diode-connected to its drain terminal to generate a bias voltage signal VN.

Four delay time adjusting buffer units 14-14a, 14-14b, 14-14c, and 14-14d are inputted with the 4-phase clock signals CLK<0>, CLK<1>, CLK<2>, and CLK<3> respectively to generate triangular wave.

Each of the delay time adjusting buffers 14-14a, 14-14b, 14-14c, and 14-14d has: an inverter switch P-type MOS transistor 14-14-1; a current controlling P-type MOS transistor 14-14-2; an inverter switch N-type MOS transistor 14-14-3; a current controlling N-type MOS transistor 14-14-4; a P-type MOS capacitor 14-14-5; and an N-type MOS capacitor 14-14-6.

The inverter switch P-type MOS transistor 14-14-1 is connected to a clock signal input inverter 14-14-0 for amplifying the input clock signal and reversing its phase and to the input power supply, and its gate terminal is connected to the output from the clock signal input inverter 14-14-0. The current controlling P-type MOS transistor 14-14-2 is connected to the inverter switch P-type MOS transistor 14-14-1 in series, and its gate terminal is connected to the bias voltage signal VP.

The inverter switch N-type MOS transistor 14-14-3 is connected to the current controlling P-type MOS transistor 14-14-2 and the ground electrode, and its gate terminal is connected to the output from the clock signal input inverter 14-14-0. The current controlling N-type MOS transistor 14-14-4 is connected to the inverter switch N-type MOS transistor 14-14-3 in series, and its gate terminal is connected to the bias voltage signal VN.

The drain terminal of the current controlling P-type MOS transistor 14-14-2 and the drain terminal of the current controlling N-type MOS transistor 14-14-4 are connected to each other, and the node therebetween functions as the output signal from this delay time adjusting inverter, and the node is further connected to the P-type MOS capacitor 14-14-5 connected to the input power supply and the N-type MOS capacitor 14-14-6 connected to the ground electrode.

Based on the triangular wave outputted from the delay time adjusting buffers 14-14a, 14-14b, 14-14c, and 14-14d, the phase interpolator 143 performs interpolation between two adjacent two signals to generate totally 16-phase interpolated clock signals PH<0> to PH<15>. The phase interpolator 143 is formed of: phase interpolation resistances 14-15 connected in series four by four between adjacent two signals outputted from the delay time adjusting buffers 14-14a, 14-14b, 14-14c, and 14-14d; and totally 16-phase interpolated clock signal output buffers 14-16 inputted with the nodes to output the interpolated phase clock signals PH<0> to PH<15>.

FIG. 16 is an operation waveform diagram of the multiphase clock signal phase interpolator 14. In FIG. 16, CLK<0>//CLK<1> shows the output signals from the delay time adjusting buffers 14-14a and 14-14b and three signals interpolated therebetween. CLK<1>//CLK<2> shows the output signals from the delay time adjusting buffers 14-14b and 14-14c and three signals interpolated therebetween. CLK<2>//CLK<3> shows the output signals from the delay time adjusting buffers 14-14c and 14-14d and three signals interpolated therebetween. CLK<3>//CLK<0> shows the state of the output signals from the delay time adjusting buffers 14-14d and 14-14a and three signals interpolated therebetween.

Further, PH<0> to PH<15> are 16-phase interpolated clock signals outputted from the multiphase clock signal phase interpolator 14.

In the multiphase clock signal phase interpolator 14 of the present embodiment, it is desirable that the value of the voltage-dividing variable resistance 14-2 for determining the rising and falling time of the triangular wave serving as its internal signal is set to the same as the value of the voltage-dividing variable resistance 8-2 in the synchronous clock signal oscillator 8 shown in FIG. 11. By setting in this way, the 16-phase interpolated clock signals PH<0> to PH<15> are arranged at regular intervals, as shown in FIG. 16.

FIG. 17 is a circuit diagram showing a detailed structure of the multiphase clock signal phase selector 12 employable in the present embodiment. The circuit structure in FIG. 17 is similar to the multiphase clock signal phase selector 12 of FIG. 13 except in that no phase interpolation resistance is arranged, and thus the same symbols are assigned to common components.

In the present embodiment, no phase interpolation resistance is required since intermediate phase clock signals are generated by the multiphase clock signal phase interpolator 14. The circuit of FIG. 17 simply selects one of the 16-phase clock signals PH<0> to PH<15> generated by the multiphase clock signal phase interpolator 14, in accordance with d<3>, d<2>, d<1>, and d<0> showing the lower 4 bits of the duty control signal d[k].

As explained above, the fourth embodiment can obtain an effect similar to the second and the third embodiments by selecting a clock signal after generating the intermediate phase clock signals by the multiphase clock signal phase interpolator 14. That is, according to the present embodiment, the accuracy of the output power voltage of the switching power supply can be improved hardly increasing cost and power consumption.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A DC-DC converter configured to convert a first DC voltage into a second DC voltage, comprising: a switching element configured to switch whether or not the first DC voltage is supplied to an output side; a lowpass filter configured to rectify an output side signal of the switching element to generate the second DC voltage; an oscillator configured to generate a plurality of clock signals each comprising a different phase; an AD converter configured to convert the second DC voltage into a first digital value comprising a plurality of bits; an error signal generator configured to generate an error signal comprising a plurality of bits, the error signal expressing a difference between the first digital value and a second digital value corresponding to a reference voltage; a counter configured to perform a counting operation in sync with a predetermined clock signal; a comparator configured to detect whether or not a value of an upper side bit of the error signal coincides with a count value of the counter; a selector configured to select one of the plurality of clock signals in accordance with a value of a lower side bit of the error signal in sync with a timing when the comparator detects coincidence; and a switching controller configured to control ON/OFF of the switching element in accordance with the clock signal selected by the selector, wherein the selector selects one among the plurality of clock signals and a new clock signal generated by combining two or more clock signals comprising neighboring phases among the plurality of clock signals: the selector generates the new clock signal by performing voltage-division of the two or more clock signals comprising neighboring phases among the plurality of clock signals, the voltage-division being performed using resisters or capacitors serially connected.

2. The DC-DC converter of claim 1, wherein the selector generates a logical addition signal of two or more clock signals comprising neighboring phases among the plurality of clock signals as the new clock signal.

3. The DC-DC converter of claim 2, wherein the selector comprises: a plurality of logical elements configured to select one of the plurality of clock signals in accordance with a logic of a lower side bit of the error signal; and a plurality of wired-OR circuits configured to generate the new clock signal by performing a wired-OR of output terminals of neighboring two logical logic elements.

4. The DC-DC converter of claim 1, wherein the oscillator comprises:

a ring oscillator unit comprising a plurality of delay variable inverters connected in a ring;

a bias voltage generator configured to generate a bias voltage for adjusting delay times of the plurality of delay variable inverters; and a clock buffer configured to perform a logical adjustment and a buffering of a clock signal outputted from the plurality of delay variable inverters.

5. The DC-DC converter of claim 4, wherein the clock buffer comprises:

an inverter serially connected to each of the delay variable inverters at odd stage; and an inverter serially connected to each of the delay variable inverters at even stage.

6. The DC-DC converter of claim 4, wherein the clock buffer comprises a plurality of logical adjusting circuits connected in parallel to an output terminal of a partial delay variable inverter in the ring oscillator unit.

7. The DC-DC converter of claim 1, wherein the error signal generator performs numerical processing for compensating a stability of the second DC voltage based on the difference between the first digital value and the second digital value to generate the error signal expressed by a digital signal.

8. A DC-DC converter configured to convert a first DC voltage into a second DC voltage, comprising:

a switching element whether or not the first DC voltage is supplied to an output side;

a lowpass filter configured to generate the second DC voltage by rectifying an output side signal of the switching element;

an oscillator configured to generate a plurality of clock signals each comprising a phase different one after another;

a phase interpolator configured to generate a plurality of interpolated clock signals each comprising a new phase obtained by interpolating phases of the plurality of clock signals to output the plurality of clock signals and the plurality of interpolated clock signals;

an AD converter configured to convert the second DC voltage into a first digital value comprising a plurality of bits;

an error signal generator configured to generate an error signal comprising a plurality of bits, the error signal expressing a difference between the first digital value and a second digital value corresponding to a reference voltage;

a counter configured to perform a counting operation in sync with a predetermined clock signal;

a comparator configured to detect whether or not a value of an upper side bit of the error signal coincides with a count value of the counter;

a selector configured to select either of the plurality of clock signals or the plurality of interpolation clock signals in accordance with a value of a lower side bit of the error signal in sync with a timing when the comparator detects coincidence; and a switching controller configured to control ON/OFF of the switching element in accordance with the clock signal selected by the selector, wherein the phase interpolator comprises:

a rectangular wave generator configured to convert each of the plurality of clock signals into a plurality of rectangular wave signals; and an interpolation clock generator configured to generate the plurality of interpolation clock signals by performing voltage-division of two rectangular wave signals, the voltage-division being performed using resisters or capacitors serially connected.

9. A digital pulse width modulator configured to control a switching element which switches whether or not to supply a first DC voltage to an output side in a DC-DC converter which converts the first DC voltage into a second DC voltage, comprising: a counter configured to perform a counting operation in sync with a predetermined clock signal; a comparator configured to detect whether or not a value of an upper side bit of an error signal comprising a plurality of bits, the error signal expressing a difference between a first digital value corresponding to the second DC voltage and a second digital value corresponding to a reference voltage, coincides with a count value of the counter; a selector configured to select one of a plurality of clock signals in accordance with a value of a lower side bit of the error signal in sync with a timing when the comparator detects coincidence; and a switching controller configured to control ON/OFF of the switching element in accordance with a clock signal selected by the selector, wherein the selector selects one among the plurality of clock signals each comprising a different phase generated by an oscillator and a new clock signal generated by combining two or more clock signals comprising neighboring phases among the plurality of clock signals, in accordance with the value of the lower side bit of the error signal, the selector generates the new clock signal by performing voltage-division of the two or more clock signals comprising neighboring phases among the plurality of clock signals, the voltage-division being performed using resisters or capacitors serially connected.

10. The modulator of claim 9, wherein the selector generates a logical addition signal of two or more clock signals comprising neighboring phases among the plurality of clock signals as the new clock signal.

11. The modulator of claim 9, wherein the selector comprises: a plurality of logical elements configured to select one of the plurality of clock signals in accordance with a logic of the lower side bit of the error signal; and a plurality of wired-OR circuits configured to generate the new clock signal by performing the wired-OR of output terminals of neighboring two logical logic elements.

* * * * *